US012601800B2

(12) United States Patent
Maunder et al.

(10) Patent No.: US 12,601,800 B2
(45) Date of Patent: Apr. 14, 2026

(54) METAMATERIAL SLAB FOR MRI

(71) Applicants: The Governors of the University of Alberta, Edmonton (CA); Alberta Health Services, Edmonton (CA)

(72) Inventors: Adam Maunder, Edmonton (CA); Nicola de Zanche, Edmonton (CA); Ashwin Iyer, Edmonton (CA)

(73) Assignees: The Governors of the University of Alberta, Edmonton (CA); Alberta Health Services, Edmonton (CA)

(*) Notice: Subject to any disclaimer, the term of this patent is extended or adjusted under 35 U.S.C. 154(b) by 256 days.

(21) Appl. No.: 18/362,942

(22) Filed: Jul. 31, 2023

(65) Prior Publication Data

US 2024/0036133 A1    Feb. 1, 2024

Related U.S. Application Data

(60) Provisional application No. 63/393,819, filed on Jul. 29, 2022.

(51) Int. Cl.
G01R 33/387 (2006.01)

(52) U.S. Cl.
CPC .................................. G01R 33/387 (2013.01)

(58) Field of Classification Search
None
See application file for complete search history.

(56) References Cited

U.S. PATENT DOCUMENTS

| | | | |
|---|---|---|---|
| 10,627,465 B2 | 4/2020 | Iyer et al. | |
| 2010/0039111 A1* | 2/2010 | Luekeke .............. | H01Q 21/065 |
| | | | 324/318 |
| 2011/0204891 A1* | 8/2011 | Drake ................ | G01R 33/3415 |
| | | | 324/309 |
| 2012/0105061 A1* | 5/2012 | Drake ................... | G01R 33/10 |
| | | | 324/318 |

(Continued)

FOREIGN PATENT DOCUMENTS

CA          3001217          10/2019

OTHER PUBLICATIONS

Jordon Clark, Advantages of Phased Array MRI Coils, https://info.blockimaging.com/bid/84437/advantages-of-phased-array-mri-coils; May 28, 2020; p. 1-8.

(Continued)

*Primary Examiner* — Steven L Yeninas
(74) *Attorney, Agent, or Firm* — Lambert Intellectual Property Law

(57) ABSTRACT

A metamaterial (MTM) slab for a Magnetic Resonance Imaging (MRI) system passively interacts with a field generated by a transmit device to improve homogeneity of the field, specific absorption rate, and/or strength of the field. The MTM slab may also be connected to RF receive circuitry at one or more ports to act as a receiver for the MRI. The MTM slab may comprise a first layer generally defining a surface and a second layer offset from the surface generally defined by the first layer, the first layer and the second layer interacting to form a 2D transmission line supporting radio frequency (RF) current along the surface in a first direction and in a second direction transverse to the first direction, the first layer and the second layer being connected via linking capacitors.

20 Claims, 38 Drawing Sheets

(56) References Cited

U.S. PATENT DOCUMENTS

| | | | | |
|---|---|---|---|---|
| 2013/0002253 A1* | 1/2013 | Werner | .................. | G01R 33/36 |
| | | | | 324/322 |
| 2013/0200897 A1 | 8/2013 | Ashwin et al. | | |
| 2015/0160312 A1* | 6/2015 | Weinberg | ............... | G01R 33/36 |
| | | | | 324/309 |
| 2015/0260812 A1* | 9/2015 | Drake | .............. | G01R 33/34092 |
| | | | | 324/322 |
| 2018/0188339 A1 | 7/2018 | Slobozanyuk | | |
| 2019/0317163 A1* | 10/2019 | Iyer | .................. | G01R 33/34046 |
| 2021/0048493 A1* | 2/2021 | Scheffler | ............ | G01R 33/3671 |

OTHER PUBLICATIONS

Vsevolod Vorobyev et al. "An Artificial Dielectric Slab for Ultra High-Field MRI: Proof of Concept"; Journal of Magnetic Resonance 320 (2020); 106835; Sep. 24, 2020; p. 1-6.

Rita Schmidt et al. "Flexible and Compact Hybrid Metasurfaces for Enhanced Ultra High Field In Vivo Magnetic Resonance Imaging" Scientific Reports; May 10, 2016; p. 1-7.

Alexey P. Slobozhanyuk et al.; Abstract of "Enhancement of Magnetic Resonance Imaging with Metasurfaces"; https://onlinelibrary. wiley.com/doi/abs/10.1002/adma.201504270; Jan. 11, 2016; p. 1-2.

Tania del Socorro Vergara Gomez; "Lightweight Metasurface Pads for Passive RF Shimming in 3T Abdominal Imaging"; https://www. ismrm.org/21/program-files/TeaserSlides/TeasersPresentations/1405- Teaser.html; May 2021; p. 1.

Endri Stoja et al.; "Improving Magnetic Resonance Imaging With Smart and Thin Metasurfaces"; Scientific Reports; www.nature. com; (2021) 11:16179; Aug. 10, 2021; p. 1-12.

"Receive-only RF Coils"; https://mriquestions.com/receive-only- coils.html; Sep. 2019; p. 1-2.

Adam Maunder et al.: Whole-Body Metamaterial Liner RF Coil for 1H at 4.7 T With Reduced SAR Compared to Birdcage Coil; https://cds.ismrm.org/protected/21MPresentations/abstracts/0183. html; Nov. 2021; p. 1-4.

4Adam Maunder et al.: Metamaterial Liner RF Head Coil for 23NA and 1H at 4.7 T; https://cds.ismrm.org/protected/21MPresentations/ abstracts/2499.html; Nov. 2021; p. 1-4.

Tim Hermann et al.: Metamaterial-Based Transmit and Receive System for Whole-Body Magnetic Resonance Imaging at Ultra- High Magnetic Fields; PLoS One; https://doi.org/10.1371/journal. pone.0191719; Jan. 25, 2018; p. 1-17.

Adam Maunder et al.: Simulation Comparison of Birdcage Coil and Metamaterial Liner for MRI at 3T and 4.7T; Proceedings of the 50th European Microwave Conference; Jan. 12-14, 2021, Utrecht, The Netherlands; p. 1067-1070.

* cited by examiner

24

50

40

40

26

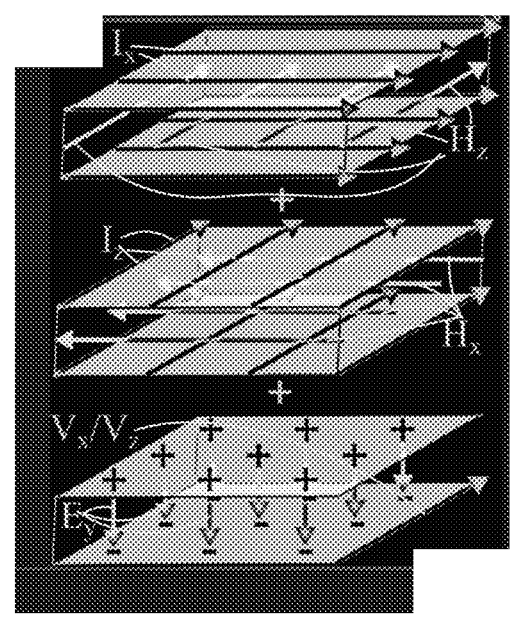
Fig. 38
Fig. 39
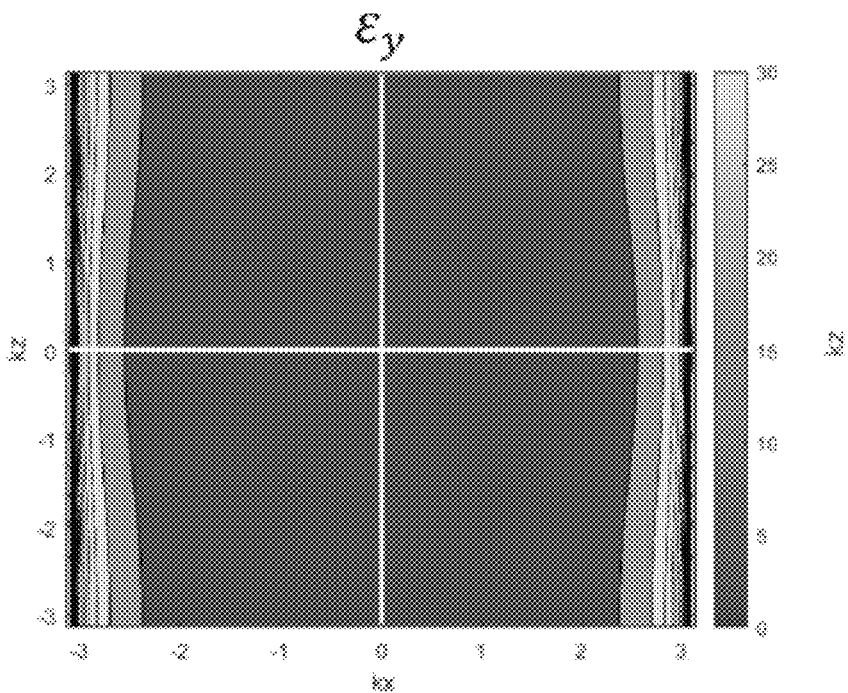

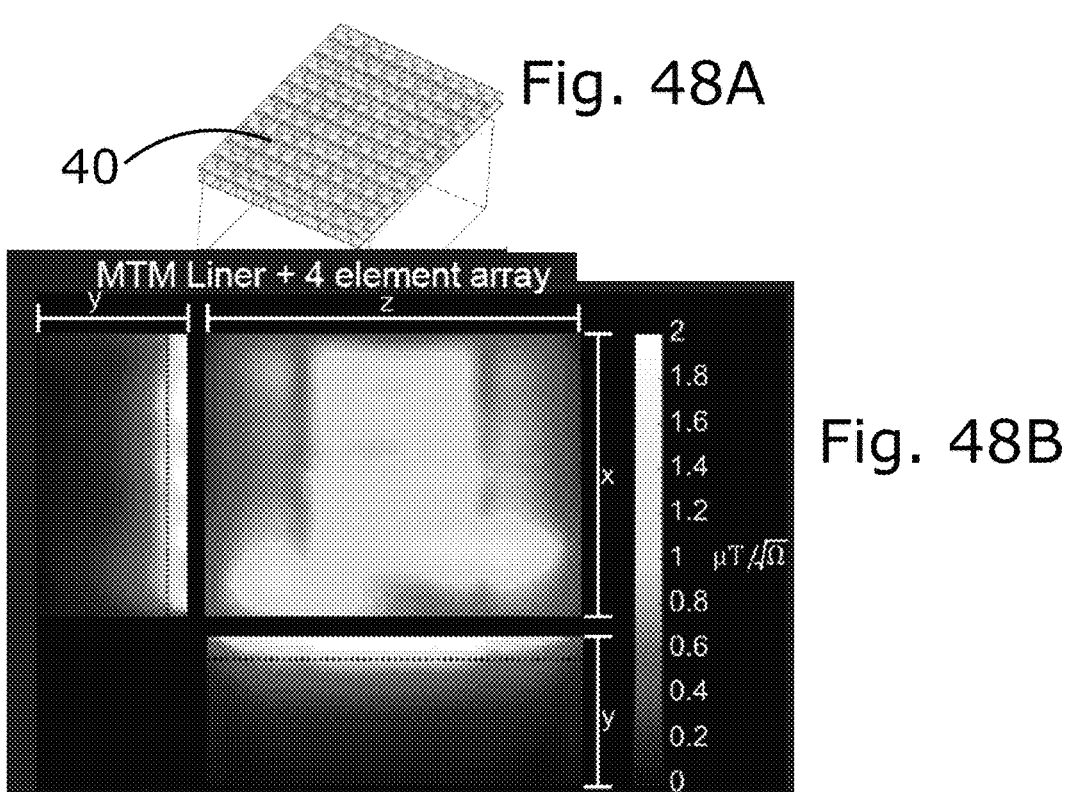
Fig. 48A
40
Fig. 48B
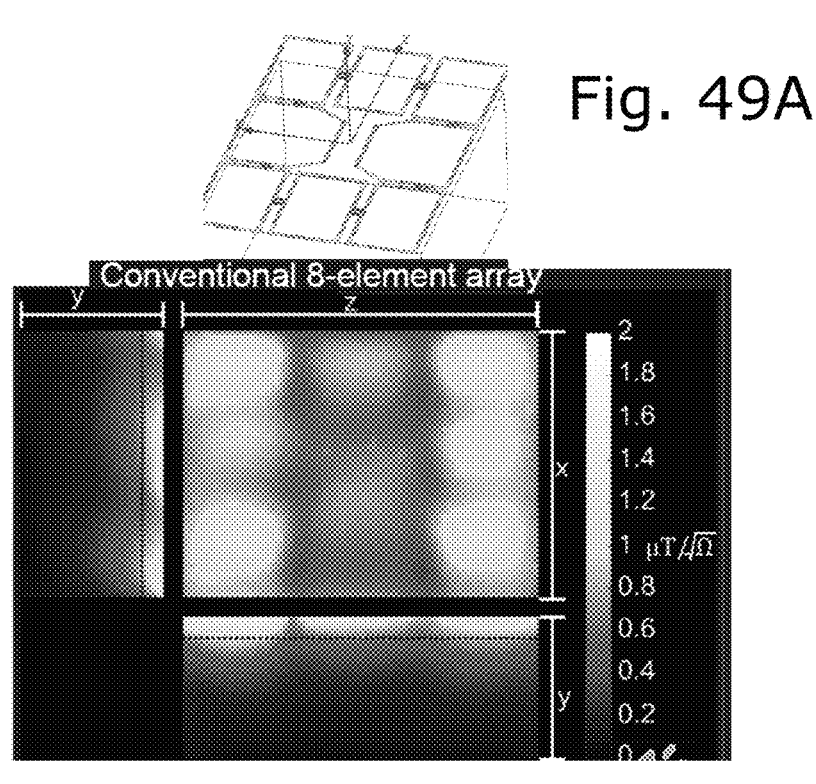
Fig. 49A
Fig. 49B

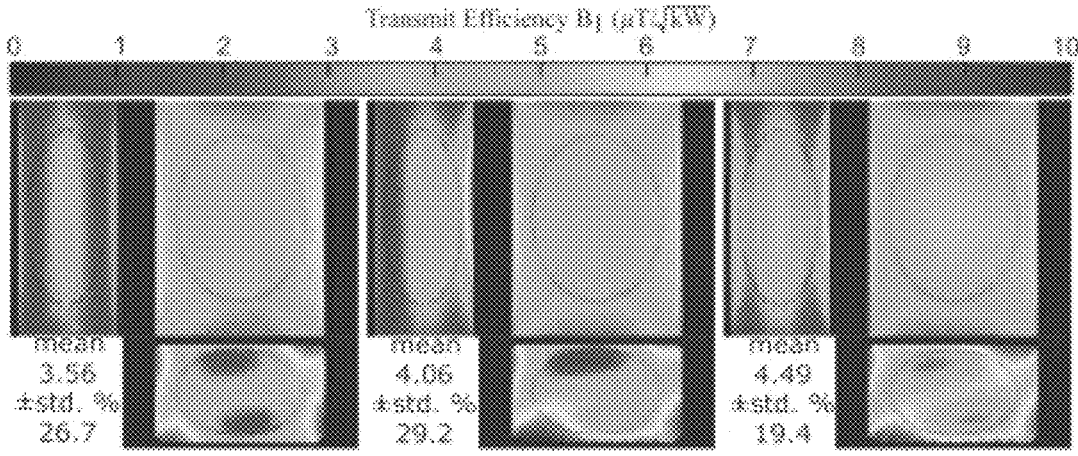
Fig. 61A        Fig. 61B        Fig. 61C
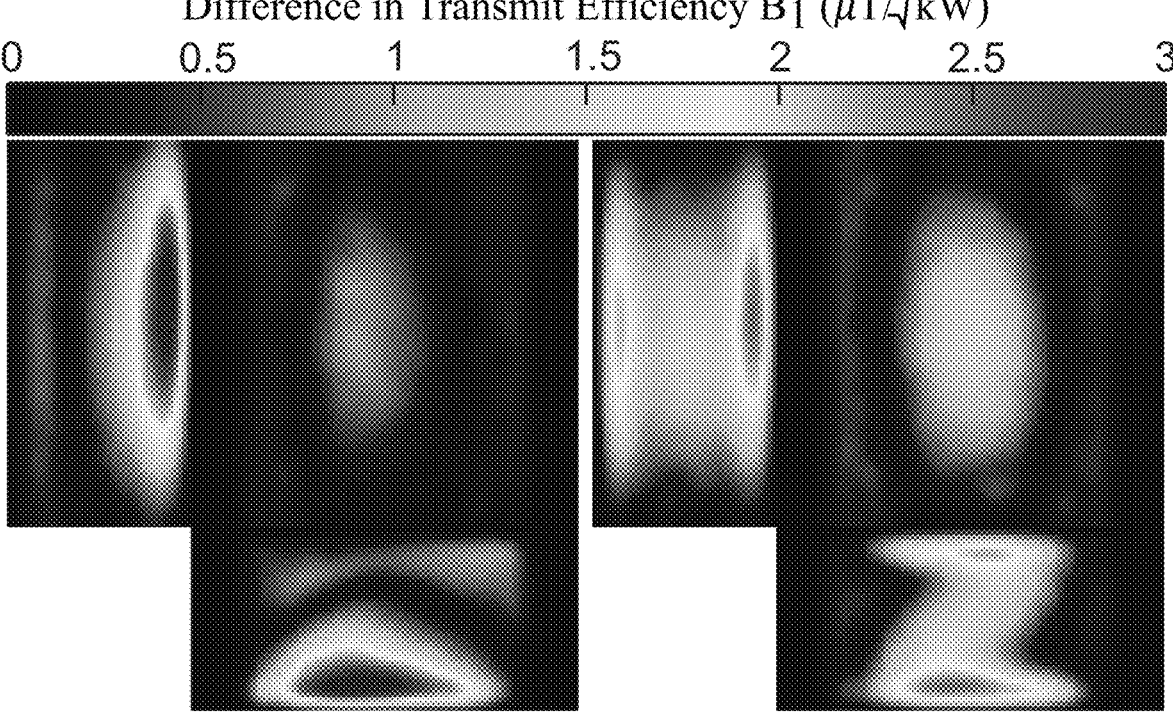
Fig. 62A                    Fig. 62B

1

METAMATERIAL SLAB FOR MRI

CROSS-REFERENCE TO RELATED APPLICATIONS

This application claims priority to U.S. Provisional Patent Application No. 63/393,819, filed on Jul. 29, 2022, which is hereby incorporated by reference in its entirety.

TECHNICAL FIELD

Magnetic resonance imaging.

BACKGROUND

In MRI, image inhomogeneity (regions of low and high image intensity) occurs because the high dielectric permittivity of the human body causes distortion of the radio-frequency magnetic fields that excite magnetic resonance and receive the magnetic resonance signal. This effect increases as the frequency of MRI (proportional to the static magnetic field strength measured in tesla) increases. For example, at 3 T-128 MHz regions of low sensitivity in the anterior and posterior regions of the body in abdominal imaging occurs. It is therefore desired to improve the homogeneity of the magnetic field. Improving efficiency of the field generation is also desirable.

In commonly performed clinical MRI scans for (cardiac, liver, lung, abdominal imaging etc.) a coil array encased in plastic is placed under the patient and on top, with elements on both sides. These arrays pick up signal and act in receive, but do not improve the transmit performance.

Metamaterials have potential uses in MRI:

U.S. patent application Ser. No. 18/143,591, filed on May 4, 2023, which is hereby incorporated by reference in its entirety, discloses transmission using metamaterial liners, which have reduced localized SAR compared to conventional transmit coils for traveling wave MRI. A metamaterial design by Duan G. et al using helical elements improved the receive sensitivity. An array of capacitively loaded rings has been shown to increase the sensitivity of coils. There are many more examples (such as metasurfaces that have been used to improve homogeneity).

SUMMARY

In an embodiment, there is a metamaterial structure, for example a slab, that interacts beneficially with the radio-frequency transmit field used to excite the magnetic resonance within a Magnetic Resonance Imaging (MRI) system. The structure may also act as a magnetic resonance radio-frequency receiver for the MRI system. The metamaterial structure comprises an array of circuit components, for example comprising a first layer 47 generally defining a surface and a second layer 48 offset from the surface generally defined by the first layer, the first layer and the second layer interacting to form a 2D transmission line supporting radio frequency (RF) current along the surface in a first direction (z) and in a second direction (x) transverse to the first direction, the first layer and the second layer being connected via linking capacitors Cy. The first layer may comprise a grid of traces, the grid comprising first traces 42 extending in the first direction (z) and second traces 51 extending in the second direction (x), the first traces including first capacitors Cz between the second traces. The second traces may include second capacitors Cx between the first traces. There may be linking capacitors Cy connected to the second traces, the second traces may also include inductors Lxt in a series with the second capacitors Cx. The metamaterial structure may be configured, for example via the choice of circuit components, parameters of the circuit components and/or the geometry of arrangement of the circuit components, to passively interact with a field generated by a radio-frequency transmit device within the MRI system to improve one or more of following: the homogeneity of the transmit field within a scan target, the specific absorption rate (SAR), and strength of the transmit field within the scan target when the metamaterial structure is present within a bore of the MRI system with the scan target. The metamaterial structure may be connected to RF receive circuitry at one or more ports to act as a receiver array for the MRI system. The metamaterial structure acting as a receiver may improve the quality and/or resolution of the images produced using the magnetic resonance signal.

In various embodiments, there may be included any one or more of the following features: the ports of the receive circuitry may be arranged to generally correspond to a current minimum of a current distribution induced by the passive interaction of the metamaterial structure with the field generated by the transmit device; one or more additional ports may be connected to the RF receive circuitry or to additional RF receive circuitry to act as multiple receive elements for the MRI system; the one or more additional ports may be arranged to generally correspond to one or more additional current minima of the current distribution induced by the passive interaction of the metamaterial structure with the field generated by the transmit device; there may be tuning elements that add or remove capacitance or inductance, for example by adding or removing electrical connections, to alter a characteristic of the metamaterial structure, such as frequency of operation, location of current minima on structure or passive interaction/coupling to the MRI radio-frequency transmitter; the metamaterial structure may be used in combination with an additional receiving array, for example comprised of conventional radio-frequency coils or other metamaterial/metasurface elements; the metamaterial structure may be configured so that, of a set of natural resonance modes of the metamaterial structure, a natural resonance mode of the set of natural resonance mode having greatest coupling to the field generated by the transmit device has a natural frequency different from a transmit frequency of the transmit device (which may be the Larmor frequency), for example such that there is little electromagnetic coupling or interaction with the field produced by the radio-frequency transmitter of the MRI system; the natural resonance modes of the metamaterial structure may have a natural standing wave pattern (of current/fields/voltages etc.) of the wavelength divided by integer multiplication of ½ (0.5, 1, 1.5 etc.) in either of two directions, for example the natural resonance mode having the greatest coupling may be a 1-wavelength standing wave, or multiple of unity wavelength, pattern in two directions, which may be the first direction and the second direction, for example where there is symmetry of the construction (2 axes, rectangular borders), but could in principle be any directions; means that those 2 directions prevail, for example the mode may be the first resonance of the $HE_{n1}$ mode; the metamaterial structure may be used in combination with an additional metamaterial structure, for example a slab, configured to passively interact with the field generated by the transmit device within the MRI system to improve one or more of homogeneity of the field within a scan target, specific absorption rate within the scan target, and strength of the field within the scan target when the additional metamaterial slab is present within a bore of the MRI system with the scan target; the metamaterial structure may be configured to operate with a birdcage coil as the transmit device; the metamaterial structure/slab/resonator may be configured to operate with a metamaterial liner as the transmit device; the metamaterial structure can be characterized as an effective medium with anisotropic permittivity and permeability; The metamaterial structure may comprise a first layer generally defining a surface and a second layer offset from the surface generally defined by the first layer, the first layer and the second layer interacting to form a 2D transmission line supporting radio frequency (RF) current along the surface in a first direction and in a second direction transverse to the first direction; the first layer and the second layer may be connected via linking capacitors (e.g. Cy), the linking capacitors may be present in each unit cell; the metamaterial slab may be characterized by inductances of or on the lines/traces on the top layer 47 and bottom layers 48 of the structure in the longitudinal (Lzt/ Lzb, not shown) and transverse (Lxt, Lxb) direction, including distributed capacitance between the top and bottom layers (Cyd) and between adjacent traces running longitudinally (Cxd, not shown) and transversely; some components, for example Cxd, may be insignificant and neglected in its characterization; tuning elements may be included for example to modify the resonance pattern and mode spacing to optimize the performance of the array in passive transmit and receive; the tuning elements may add or remove capacitance or inductance to alter a characteristic of the metamaterial structure; the tuning elements may include capacitance tuning elements for example arranged to adjust capacitance of the second capacitors (e.g. transversely oriented capacitors in series with the traces [2Cx]); the tuning elements may include inductance tuning elements for example arranged to tune inductances in series with the linking capacitors (e.g. Cy); these inductances may be lengths of inductor with intrinsic inductance [Ly] in series with the capacitors [Cy].

These and other aspects of the device and method are set out in the claims.

BRIEF DESCRIPTION OF THE FIGURES

Embodiments will now be described with reference to the figures, in which like reference characters denote like elements, by way of example, and in which:

FIG. 38 illustrates a process of effective medium approximation for the rectangular MTM slab shown in FIG. 9.

FIG. 39 shows the y-direction permittivity for the effective medium approximation for a rectangular MTM slab shown in FIG. 9.

FIG. 48A shows an isometric view of a model of an embodiment of an MTM slab.

FIG. 48B shows a chart of receive sensitivity of a combination of a four-element array (not shown) and the model shown in FIG. 48A.

FIG. 49A shows an isometric view of a model of a conventional 8 element receive coil array.

FIG. 49B shows a chart of receive sensitivity of the model shown in FIG. 49A.

FIG. 61A is a chart of the simulated transmission efficiency maps in three orthogonal slices for only a BC without MTM slabs.

FIG. 61B is a chart of the simulated transmission efficiency maps in three orthogonal slices for an embodiment of a single MTM slab and BC.

FIG. 61C is a chart of the simulated transmission efficiency maps in three orthogonal slices for an embodiment of two MTM slabs and a BC.

FIG. 62A is a graph of the difference in transmit efficiency for an embodiment of a BC and one MTM slab compared to without an MTM slab.

FIG. 62B is a graph of the difference in transmit efficiency for an embodiment of a BC and two MTM slabs compared to without an MTM slab.

DETAILED DESCRIPTION

Figures 1, 2:
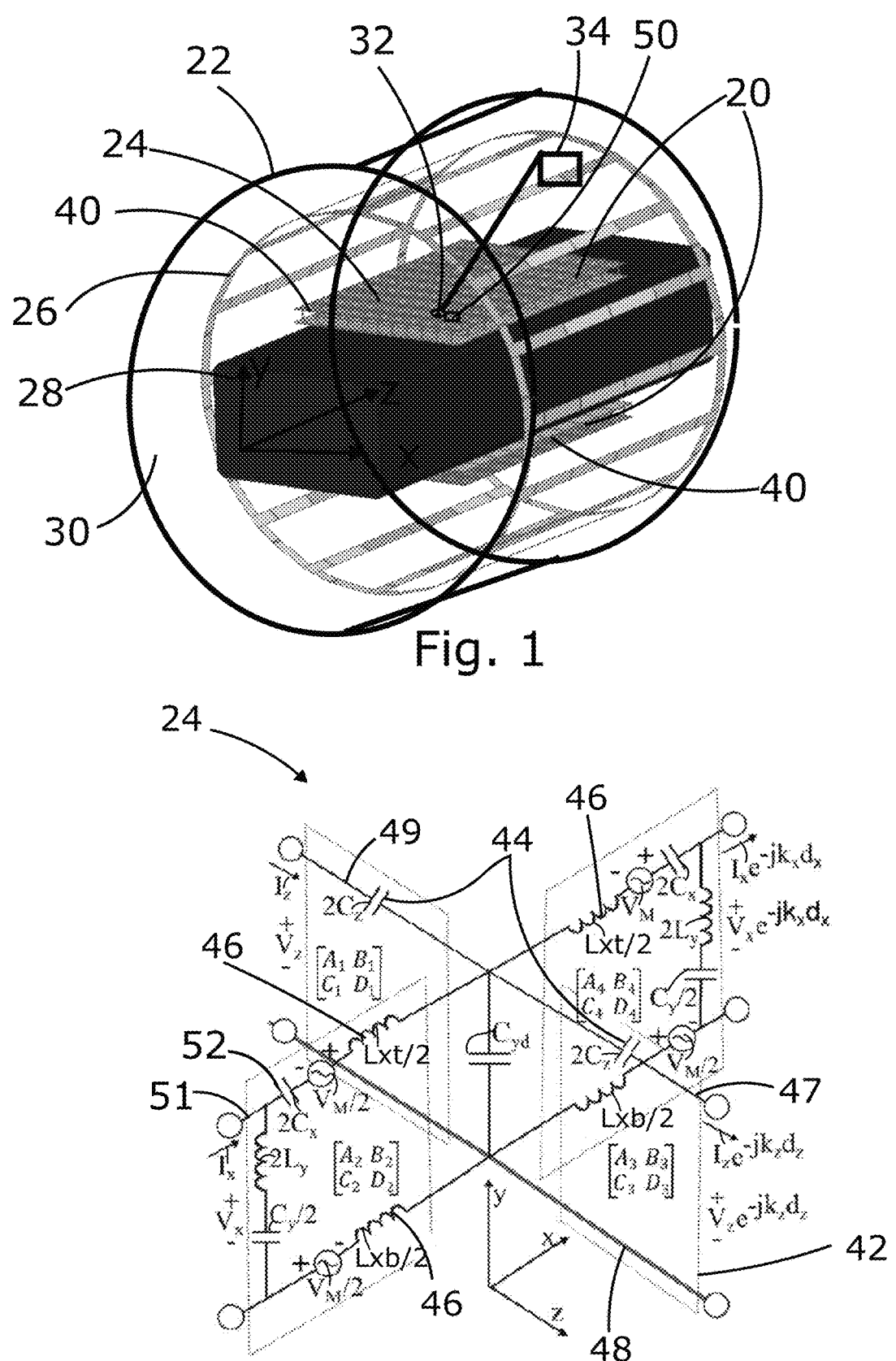
FIG. 1 is an isometric view of an embodiment of a metamaterial (MTM) receiver, an MTM slab, an MRI, a transmit device, and a scan target, here a phantom.
FIG. 2 is a circuit representation of the unit cell of a metamaterial structure, where an array of unit cells comprises the embodiment in FIG. 1.

Users prefer higher static field strengths in MRI because they provide better signal to noise ratio (SNR). A problem is that higher field strengths mean higher frequency signals which introduce standing waves. These degrade image quality by introducing signal voids (dark areas where the anatomy is invisible) and could harm the patient due to the increase of specific absorption rate (SAR). In the prior art, the standing wave patterns may be mitigated using the polarization (displacement) currents from dielectric pads placed on the patient. However, they can be heavy and are limited by material properties of natural materials (e.g., maximum permittivity achievable).

In an embodiment of the invention, a metamaterial slab or liner may act as a dielectric pad, for example for thoracic and abdominal imaging or other similar forms of imaging and replace the dielectric pad. The Metamaterial slab 40 provides numerous advantages over the dielectric, including, for example, weight reduction and the metamaterial slab 40 may be designed to have the properties required by the user.

The metamaterial slab passively improves transmit performance by increasing homogeneity, increasing transmit efficiency, and reducing specific absorption rate, thus counteracting the negative effects of standing waves.

The transmit Performance of an embodiment of a Metamaterial Slab as a Passive RF Shimming Element for 3 T MRI is disclosed herein.

Generally, higher field strengths provide higher signal to noise ratio (SNR). The issue is that higher field strengths bring standing waves. These waves degrade image quality and cause a higher specific absorption rate (SAR). This can be passively counteracted with dielectric pads. However, these pads have drawbacks. The pads are heavy and limited by material properties. In an embodiment of the invention, a metamaterial slab replaces and acts as a dielectric pad. The embodiment may be used for numerous imaging types, including, for example, thoracic or abdominal imaging. Advantages of the embodiment is that it is not limited by material properties and may act as a receive element.

At higher static magnetic field strengths (3 T) characteristic regions of low transmit fields occur that degrade the quality and diagnostic efficacy of MRI. Disclosed herein is the simulation, and measurement of thin (2 cm), lightweight metamaterial (MTM) slabs for 3 T that manipulate the field produced by a birdcage (BC) volume resonator for improved transmit performance. In a torso-sized phantom (an object used to simulate a human body), a measured 39% increase in the mean flip angle and 4.9% reduction in the percent coefficient of variation was found, while the specific absorption rate normalized to the mean transmit field was reduced by 32% by the inclusion of the MTM slab, as compared to a volume coil alone.

As the Larmor frequency increases with higher static magnetic field strengths, the high dielectric permittivity and shape of the human body distorts the radio frequency (RF) right circularly polarized transmit field ($B_1^+$) that produces MR excitation. This results in characteristic field nulls in the anterior and posterior region of the body when using the birdcage coil (BC) volume resonator, which is a particular problem for abdominal or thoracic imaging at 3 T. The gain in signal-to-noise in body imaging from 1.5 T to 3 T is thus compromised by signal loss and inhomogeneous image contrast. High permittivity pads have been employed to reduce the field nulls, improve transmit efficiency and reduce specific absorption rate (SAR). However, dielectric pads are bulky, heavy (4-20 kg), are restricted to the relative permittivity values of naturally occurring materials (1-500), have associated losses (0.2-10 S/m), interfere with the placement and operation of receive arrays and do not contribute to channel density (i.e., cannot be employed receive elements). The use of dual-channel transmit MRI with the BC can result in similar levels of improvement, but the greatest improvement is obtained when both methods are used concurrently. Conversely, metamaterials (MTMs) can be lighter, can be tuned and optimized by varying their effective electromagnetic parameters, and can provide equivalent or better performance. Disclosed herein is an embodiment of the use of a Metamaterial slab 40 based on 2D transmission line elements and compare the imaging performance when employed on both the anterior and posterior sides of a large torso-sized phantom. Furthermore, an embodiment of the slab may be employed as a receive array, thereby providing improvements in both transmit and receive.

A metamaterial may be defined as a periodic array of elements designed to have exotic electromagnetic properties. An embodiment of the invention uses a metamaterial (MTM) structure, for example shaped as a slab, which may also be referred to as a panel. The metamaterial structure may also be referred to as a lens or resonator, The metamaterial structure may also be connected to be used as a receiver 20 to replace or supplement conventional receive coils typically used in an MRI. In an embodiment, the MTM slab 40 performs equally well or better than coils as elements of a receive array for the magnetic resonance signal, while also improving the transmit field significantly.

In an embodiment of the invention shown in FIG. 1, there is a metamaterial slab 40 for a Magnetic Resonance Imaging (MRI) system 22. The metamaterial slab 40 comprises an array of circuit components 24 (as shown, using a single unit coil, in FIG. 2) forming a 2D transmission line. In the embodiment, the metamaterial slab 20 may be configured to passively interact with a field generated by a transmit device 26 within the MRI system 22 to improve one or more of homogeneity of the field within a scan target 28, a specific absorption rate within the scan target 28, and a strength of the field within the scan target 28, when the metamaterial slab 20 is present within a bore 30 of the MRI system 22 with the scan target 28. The metamaterial slab 40 may be connected to RF receive circuitry 34 at a port 32 to act as a receiver 20 for the MRI system 22. The scan target 28 may be, for example, a phantom for testing and simulation or a human. The scan target 28 could further be a specific portion of the human, for example, a head or thoracic portion of the human.

In an embodiment of an invention, a metamaterial slab 40 acts as a receive element 20. The embodiment may be used for numerous imaging types, including, for example, thoracic or abdominal imaging. Some advantages of example embodiments are as follows: the metamaterial slab 40 can provide equal or greater receive sensitivity to a conventional array, take up same amount of space, and still passively improve the transmit performance.

A metamaterial slab 40 may be used as a receive element alone or in combination with one or more additional receive elements, for example a companion array which may be a conventional coil array.

Figures 11, 12:
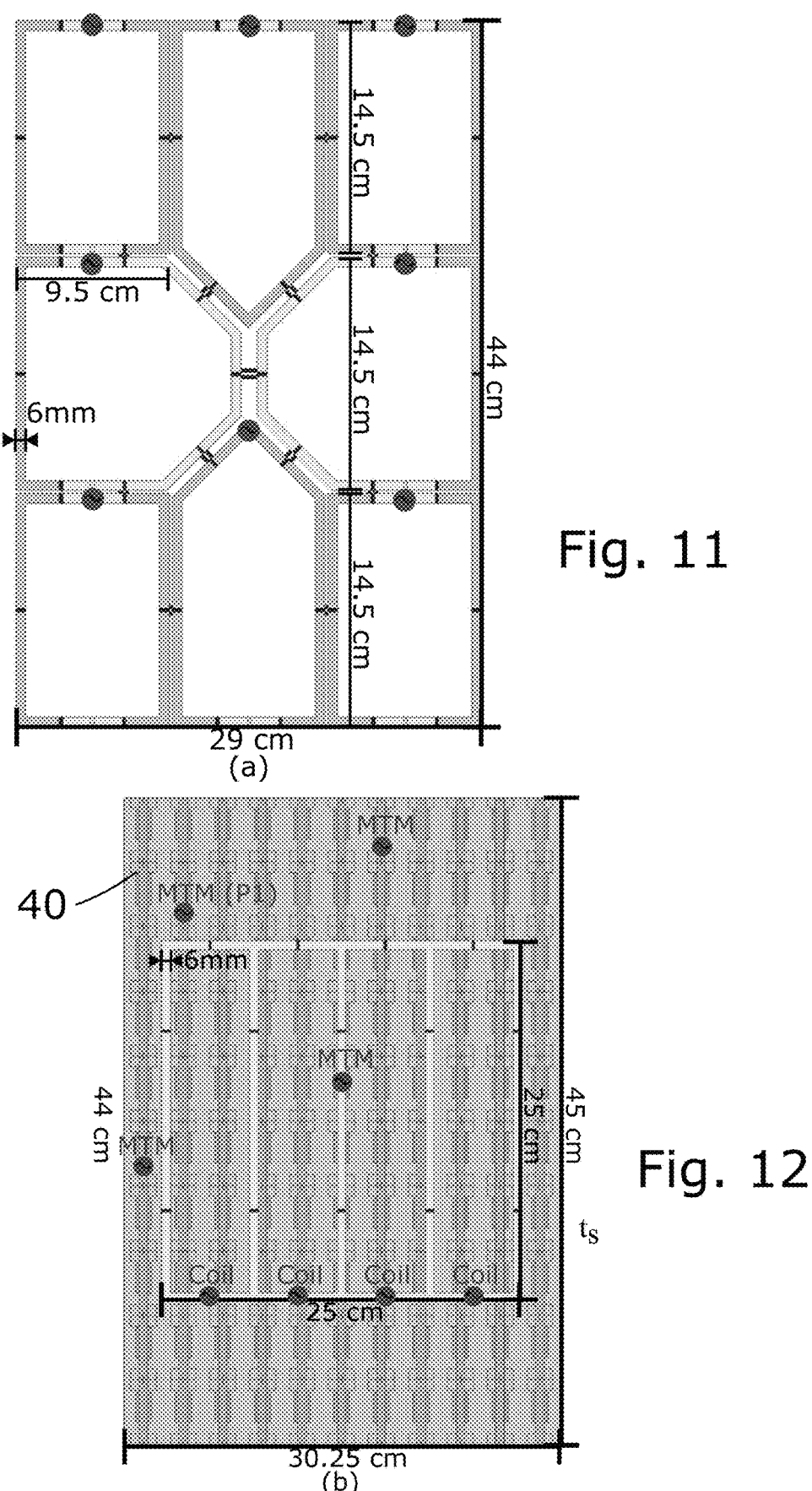
FIG. 11 shows a top view of a comparison array.
FIG. 12 shows a top view of an embodiment of a MTM slab and a companion array.

A metamaterial slab 40 with companion array is pictured in FIG. 12. In an embodiment, the pre-amplifier decoupling was achieved with lattice baluns, but the metamaterial slab 40 required extra PIN diode network so that the ports would be shorted in transmit. This allowed it to act passively.

In an embodiment, the port 32 may be arranged to generally correspond to a current minimum of a current distribution induced by the passive interaction of the receiving metamaterial slab 20 with the field generated by the transmit device 26. There may be one or more additional ports 32 connected to the RF receive circuitry 34 or to additional RF receive circuitry 34 to act as multiple receive elements for the MRI system 22.

Figure 4:
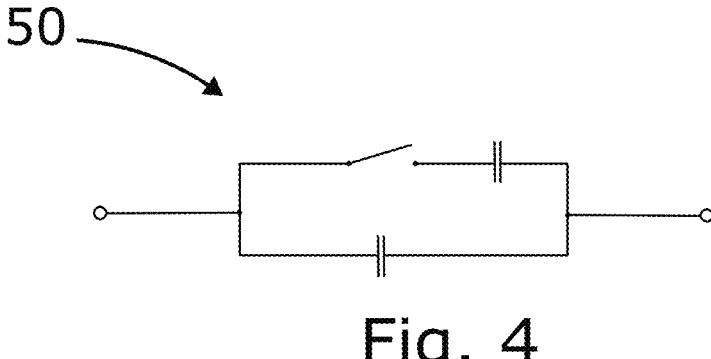
FIG. 4 is an embodiment of a tuning element.

There may be tuning elements 50, as shown in FIG. 1 and FIG. 4, arranged to add or remove capacitance or inductance, for example by adding or removing electrical connections to alter a characteristic of the metamaterial slab. In the example shown in FIG. 4, a switch is arranged to connect an additional capacitor to increase a capacitance value. Inductances may be formed as specific elements (e.g. lumped air-coil inductors) or formed as the inductance inherently caused by a specified trace length. Inductance values may be tuned for either variety of inductance.

The metamaterial slab 40 may further be configured to have a natural resonance mode at a frequency different from a frequency of the transmit device 26. For example, the natural resonance mode with the different frequency is a 1-wavelength standing wave pattern in both directions. The metamaterial structure/slab/resonator 20 may have a resonance configured to couple to the field generated by the transmit device 26 within the MRI system 22. For example, the resonance configured to couple with the field generated by the transmit device 26 within the MRI system may be the first resonance of the $HE_{n1}$ mode.

There may be multiple metamaterial slabs 20 used in combination within an MRI system, for example above and below a scan target within an MRI bore. In an example, one or more of the metamaterial slabs may be used for receive. In an example, a metamaterial slab 20 used for receive, as well as an additional metamaterial slab 40, may be configured to passively interact with the field generated by the transmit device 26 within the MRI system 22 to improve one or more of homogeneity of the field within a scan target 28, specific absorption rate within the scan target, and strength of the field within the scan target when the additional metamaterial slab 40 is present within a bore 30 of the MRI system 22 with the scan target 28.

Likewise, a single metamaterial slab 40, whether used for receive or not, may be configured to passively interact with a field generated by a transmit device 26 within the MRI system 22 to improve one or more of homogeneity of the field within a scan target 28, specific absorption rate within the scan target, and strength of the field within the scan target when the metamaterial slab 40 is present within a bore of the MRI system with the scan target 28.

A metamaterial slab 40 may be characterized as an effective medium with anisotropic permittivity and permeability.

As is, the metamaterial slab 40 may comprise a 2-dimensional array of plural transmission lines 42, for example to form a 2D transmission line (shown in FIG. 2), each transmission line including capacitors 44 connected in series. The adjacent transmission lines of the plural transmission lines may be connected by inductors 46, e.g. top layer inductors Lxt and bottom layer inductors Lxb. Further, the inductors 46 may be in a series with additional capacitors 52. The 2D transmission line may be formed from multiple layers, here top 47 and bottom 48, connected by capacitors Cy/2. In an example, 2Cx and 2Ly are tunable elements. In general all branches could have both inductance and capacitance. E.g., in FIG. 2 $C_{yd}$ or $C_x$ could be drawn with inductance in series because all connections include some inductance, though in embodiments where inductance is considered negligible it may be omitted from the drawings.

The metamaterial structure/slab/resonator 20 may be configured to operate with a birdcage coil as the transmit device 26. The metamaterial structure/slab/resonator 20 may be configured to operate with a metamaterial liner as the transmit device 26. The transmit device 26 may be a transverse electromagnetic (TEM) coil. The transmit device 26 may be any device that operates to emit the required RF field within the MRI system 22.

The metamaterial slab may be used and placed in the same location as would a conventional receive array, so that the metamaterial slab 40 does not occupy additional space over what would be used otherwise by, for example, traditional coils. Depending on the embodiment, aspects of the work may include the following: the metamaterial slab can be characterized as an effective medium with anisotropic permittivity and permeability; the metamaterial can be designed by equations describing it as a 2D transmission line; the metamaterial can be made of lightweight materials (thin 0.25 mm laminates with copper cladding and plastic); in receive, multiple ports can be placed at strategic points on the metamaterial liner so that it is used as multiple receive elements; conventional receive arrays with complementary sensitivity profiles, or regions of high sensitivity, can be combined with the metamaterial slab for higher element account; the resonance mode of the slab during receive can be tuned differently from that which interacts and manipulates the transmit field; additional isolation between the active transmit resonator (typically a volume birdcage coil) and receive circuitry is provided by networks that are electrically switched (using diode, FET, etc.) during transmit; the metamaterial slab can be tuned by use of switching elements, or additional tuning elements that add/remove capacitance or inductance by adding/removing electrical connections.

In embodiments, it was determined that in transmit, the transmit efficiency and homogeneity are improved as compared to transmission without them. Further, in transmit, for the same MR excitation, the power deposited into the body decreases (measured by the specific absorption rate). Further still, in receive, the metamaterial slab can perform as well (equivalent sensitivity over a specified field-of-view) as conventional arrays with the same number of elements.

In an embodiment, the metamaterial may be optimized in its design by characterizing the metamaterial slab in terms of its anisotropic permittivity and permeability based on its tuning and frequency of operation, and applying these characteristics in a simulation based on the field strength and the geometry and electrical properties of the human body, to find which parameters best improve desired outcomes such as transmit field homogeneity and efficiency.

A prototype embodiment of the device has been built and tested. The performance has been measured by on-the-bench tests and MR imaging tests. The improvement provided in transmit has been verified by close match to simulation results. The embodiment's performance in receive has been verified by comparison to a conventional receive array with the same number of elements.

A presented embodiment of a metamaterial slab may differ from embodiments of a metamaterial liner, for example as disclosed in U.S. patent application Ser. No. 18/143,591, which is hereby incorporated by reference in its entirety, in a number of ways, for example, as follows: the slab may not be excited directly in transmit; the slab may not promote traveling waves; the slab may emulate specific metamaterial parameters to shape/control the field produced by the transmit coil (which could be a metamaterial liner or birdcage, etc.) for improved performance (transmit efficient and homogeneity).

In an embodiment of the invention, the slab may not be at a resonant mode that strongly couples to the birdcage coil, the mode interacting with the field is far off-resonance (104 MHz vs 128 MHz in an example implementation).

In an embodiment of the invention, there may be a separate resonant mode of the slab (on-resonance with the MRI frequency) that is being used in receive. This mode may be independent of the slab's operation for transmit enhancement.

The slab may be placed in other locations, but may be effective in an embodiment when its position is chosen to optimize the transmit homogeneity.

In an embodiment, the slab may be used in relation to specific field strengths of 3 and 4.7 T, but there is no barrier to higher or lower field strengths, for example 7 or 1.5 T. At lower field strengths the homogeneity improving aspect of the slab may be less important as the homogeneity of the transmit field is already relatively even, but this may not always be the case.

The design of an embodiment of an MTM liner is now described. In the MTM liner, 10 element long strips of the MTM may be 1D transmission lines that are inductively coupled to adjacent strips to form a 2D transmission line. A natural resonance mode with 1-lambda standing wave pattern in both directions may be targeted to prevent coupling of the receive mode to the birdcage coil (BC). A companion array was demonstrated to operate in conjunction with the metamaterial slab with sensitivity pattern that complemented that of the receive mode profile of the metamaterial slab. In the example tested, the companion array had high sensitivity in the center of the slab where the slab had a sensitivity null. The resulting images have thus much improved uniformity than in the absence of the slab. The companion array, in this example, was 4-channels, adjacent loops decoupled by lumped capacitors in shared segments. A comparison array in which example was 8-channels, adjacent loops decoupled by capacitive networks.

In an embodiment, the MTM unit cell may be formed using parallel plate capacitors etched from copper plates sandwiching Rogers® dielectric. The connections may be made with copper tape and solder. The supporting structure may be made of polycarbonate and PVC blocks secured with nylon screws (low permittivity materials).

Figure 13:
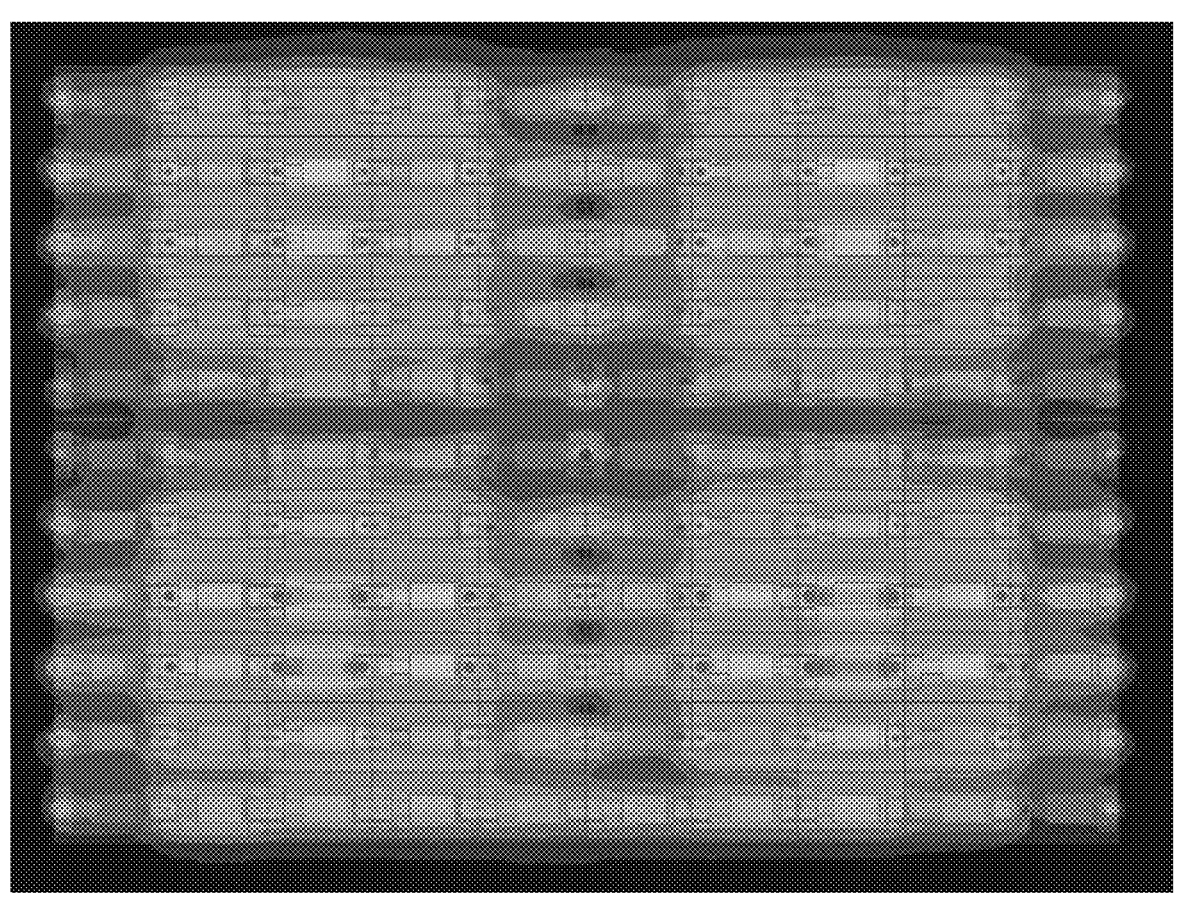
FIG. 13 shows a chart of a top view of a field within an MTM slab.
Figure 14:
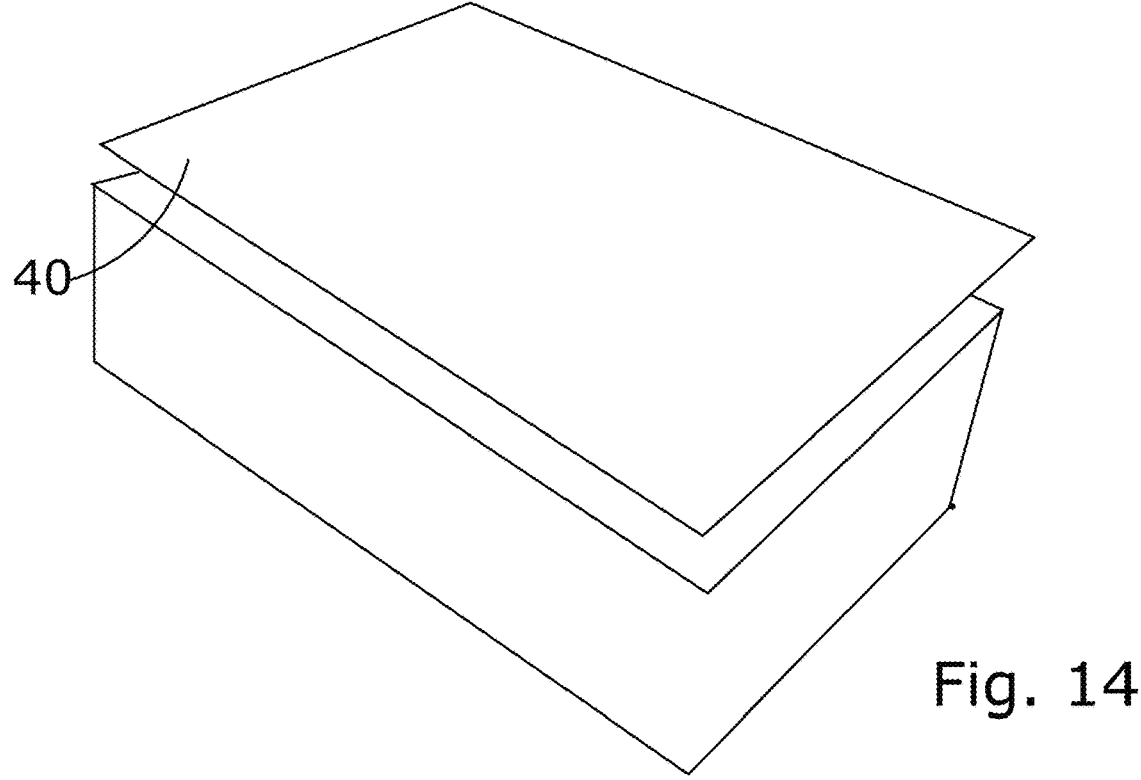
FIG. 14 shows an embodiment of an MTM slab with a companion array.
Figures 15A, 15B, 16A, 16B:
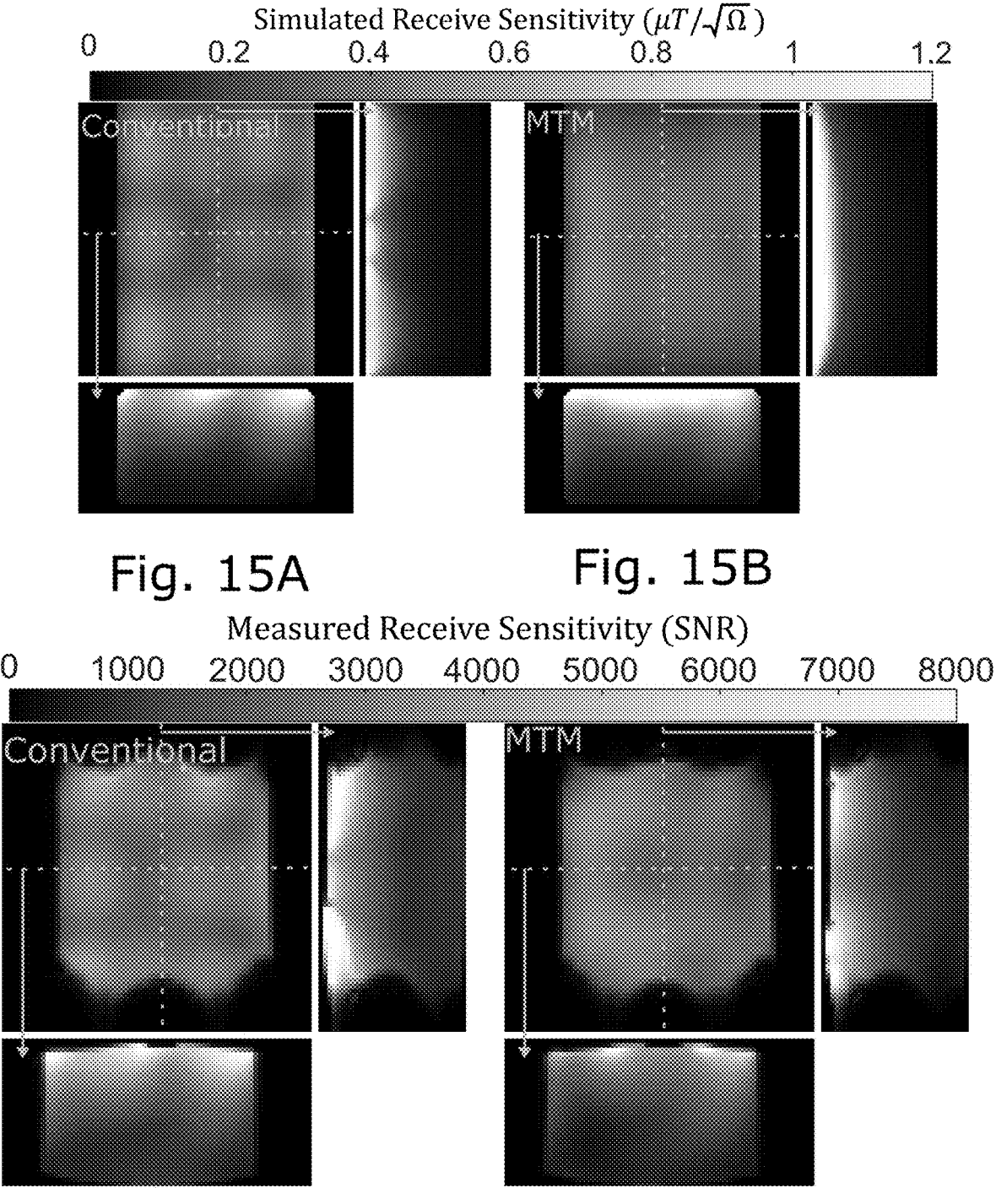
FIG. 15A shows the results of the simulated receive sensitivity for a conventional receive array.
FIG. 15B shows the results of the simulated receive sensitivity for an MTM receiver.
FIG. 16A shows the results of the measured receive sensitivity for a conventional receive array.
FIG. 16B shows the results of the measured receive sensitivity for an MTM receiver.

FIGS. 13-17 show simulation and design details for the MTM slab and companion array shown in FIG. 12. FIG. 11 shows a comparison array against which this embodiment was compared. FIG. 12 shows an embodiment of a metamaterial slab 40 with a companion array. FIG. 13 shows a chart of a magnetic field strength within a metamaterial slab. FIG. 14 shows the construction of an embodiment of an (MTM) metamaterial slab 40. FIGS. 15A-16B show the results of the receive sensitivity. In the results, the simulated and measured results look similar. The coronal plane looks more homogeneous in simulation. In the comparison between the simulated and measured results, the central loops of the companion array were not as sensitive as predicted.

Figure 17:
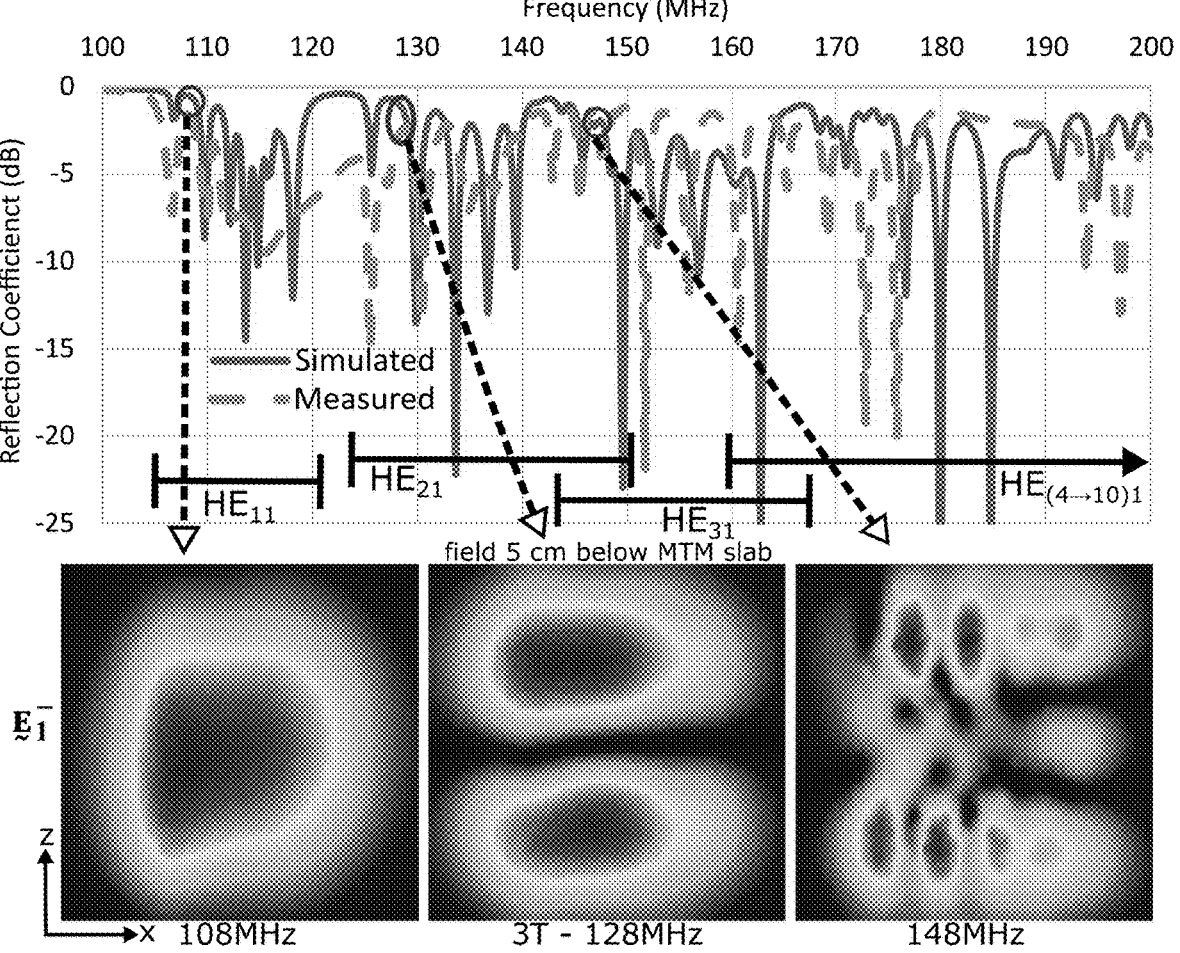
FIG. 17 shows the simulated and measured results of the scattering parameters for an MTM receiver.

FIG. 17 shows the results for network parameters. The reflection spectrum at port 1 shows different modes. Tuning for HE11 (hybrid electric) mode resulted in BC coupling. Higher frequencies resulted in mode mixing. The frequency of standing wave resonances on the metamaterial slab are shown to be located by dips in the reflection coefficient. Clusters of the resonances are shown to represent approximate ranges for resonances associated with different Hybrid electric ($HE_{n1}$) modes, where n is the mode order. The BC couples strongly with the first resonance of the $HE_{n1}$ mode of the metamaterial slab, and it is this coupling, which is largely off-resonance (128 MHz vs. ~104 MHz) that results in the passive enhancement of the transmit field by the metamaterial slab. The metamaterial slab is tuned at 128 MHz for a natural resonance of the second standing wave (1-lambda resonance) of the HE21 mode.

An embodiment of the metamaterial slab 40 provides passive improvements in transmit: 39% better transmit efficiency. Further, the embodiment improves homogeneity and lowers the SAR. These transmit improvements are combined with receive functionality. In the combination, similar performance was obtained as in a conventional array and further both methods occupy the same area.

In an example construction, parallel plate capacitors were etched from copper plates sandwiching rogers dielectric. Connections were made in the example with copper tape and solder. Structure was made of polycarbonate and PVC blocks secured with nylon screws (low permittivity and low loss materials).

Validation was done using H-field probes and a vector network analyzer. Simulations were used to determine where to expect minima/maxima for the desired mode. As you move one probe along the space above the MTM, transmission minima and maxima occur at different frequencies and location for a given mode, which matches the minima/maxima of the H-fields determined by simulation. Therefore, in practice by correlating simulation and H-field probe measurement you can determine at what frequency the desired mode occurs and whether tuning is necessary.

In the constructed and validated design, preamplifier decoupling was achieved with lattice baluns, but MTM required extra PIN diode network so ports would be shorted in transmit allowing it to act passively in transmit.

An MTM slab 40 may act as both an MTM receiver 20, if connected to receive circuitry 34, and as an MTM slab 40 that passively interacts with the field.

Simulations were done on embodiments of the invention. An eigenmode analysis was done on a 10 unit cell strip with boundary conditions. Then a metamaterial slab 40 with a phantom was simulated to perform tuning and determine field maxima locations. The simulations were also run with the BC, a phantom, and with a second metamaterial slab 40.

The comparison array was tested on its own. The metamaterial slab 40 was also tested with the companion array on top of phantom, and second purely passive metamaterial slab 40 on the bottom. After analyzing the testing and simulations, it was determined that the simulations and experimental results resemble each other. However, the simulated field in the coronal plane looks more homogeneous with the metamaterial slab 40. In actuality, it was determined that the central coil elements for the companion array were not as sensitive as expected.

The mode locations were visible by viewing the reflection coefficient spectrum. The modes could be located by large dips which are resonances in the x-direction. This displays the approximate ranges for Hybrid electric modes. Additionally, if tuned directly for $HE_{11}$, the BC couples directly with the MTM. If tuned higher, mode mixing occurs, as shown in FIG. 17 at 148 MHz. It was determined that the metamaterial slab 40 provides passive improvements to transmit performance. The passive transmit improvements may be combined with the receive functionality. It was determined that the performance of the metamaterial slab 40 in receive with its companion array was similar to the conventional array. Further, both methods occupied roughly the same area.

Previously, metamaterials (MTMs) have been employed in MRI to alter and provide localized enhancement of MRI signal acquired using a traditional detector (coil) (M. J.

Freire, L. Jelinek, R. Marques and M. Lapine, "On the applications of $\mu_r=-1$ metamaterial lenses for magnetic resonance imaging," J. Magn. Reson., 203(1)81-90, 2010.) However, adding an MTM resonator to an existing coil or array increases complexity and extends the dimensions occupied. Furthermore, comparisons of set-ups involving metamaterials and coil arrays have not been optimized, and it is believed that MTMs may increase the SNR (signal to noise ratio) for a lower channel count. Finally, demonstrations of the use of metamaterials to receive the MR signal have not investigated active decoupling from the transmit system (G. Duan, X. Zhao, S. W. Anderson and X. Zhang, "Boosting magnetic resonance imaging signal-to-noise ratio using magnetic metamaterials," Communications Physics, 2(1), 1-8, 2019), which can degrade the global transmit homogeneity and increase local specific absorption rate, both of which are unacceptable in clinical imaging.

Figure 3:
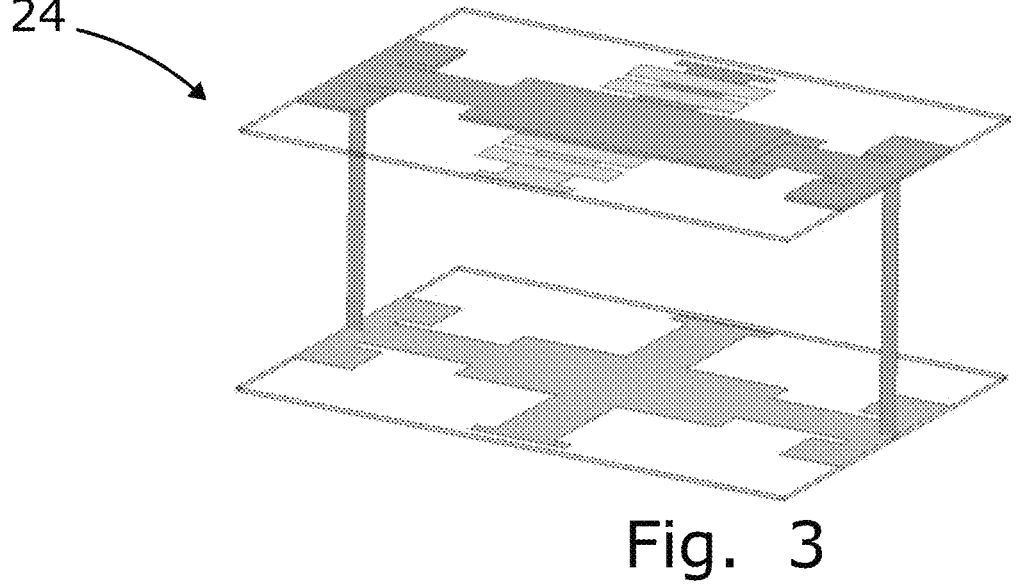
FIG. 3 is an embodiment of an MTM unit cell.

Theoretical and experimental exploration of thin MTM liners exhibiting negative near zero permittivity on the inside of cylindrical waveguides have demonstrated below-cutoff electromagnetic propagation at approx. 3.2 GHz. A similar thin MTM liner along the MRI bore can produce efficient excitation like conventional birdcage resonators, but with a lower specific absorption rate. Employing similar methods to analyze the MTM's propagation behavior, we demonstrate the design of a rectangular MTM lens (slab). An embodiment of an MTM unit cell of the MTM liner is shown in FIG. 3 and with more detailed labeling in FIGS. 5 and 6. The lumped transmission line elements of the slab may form a 2D transmission line as illustrated in FIG. 2. The electric and magnetic fields within the slab are strong, due to the effective large permeability and small near zero permittivity (at cut-off) of the structure. The MTM structure is analogous to a leaky-wave rectangular waveguide, which enables its operation as a receiver of MR signal.

Tuning the parameters of the 45×32×2 $cm^3$ Metamaterial slab 40 for a $\lambda$-resonance in both x- (comparable to the $TE_{20}$ mode) and z-directions produces strong transverse magnetic fields (parallel to the slab's surface) at the Larmor frequency (128 MHz for 3 tesla MRI) relevant for reception (slab and coil array shown in FIG. 12, field shown in for example FIG. 17). In contrast, to produce the same 2D $\lambda$-resonance in an equal sized empty rectangular waveguide would require a frequency >1 GHz.

Figure 18:
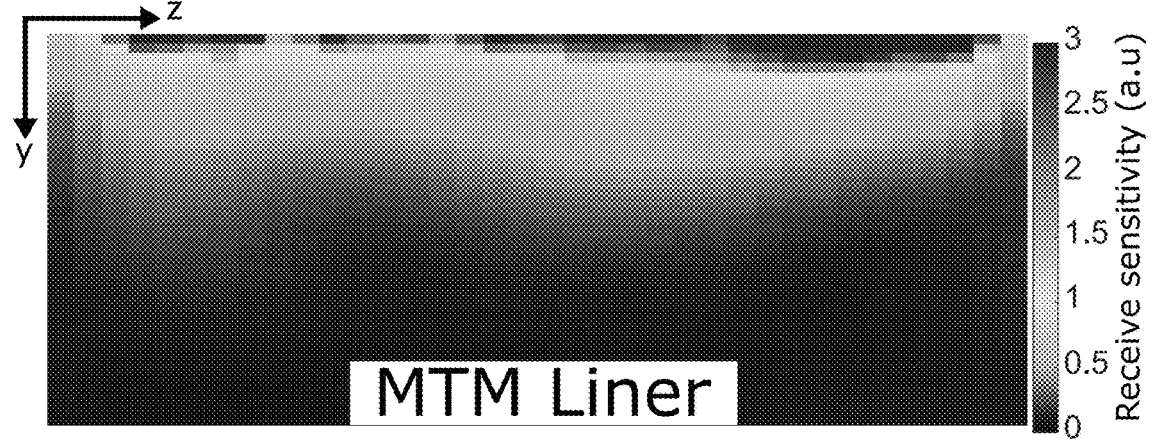
FIG. 18 is a graph displaying the receive sensitivity profile (in arbitrary units) of an array of receivers comprising ports on the metamaterial slab/structure/resonator.
Figure 19:
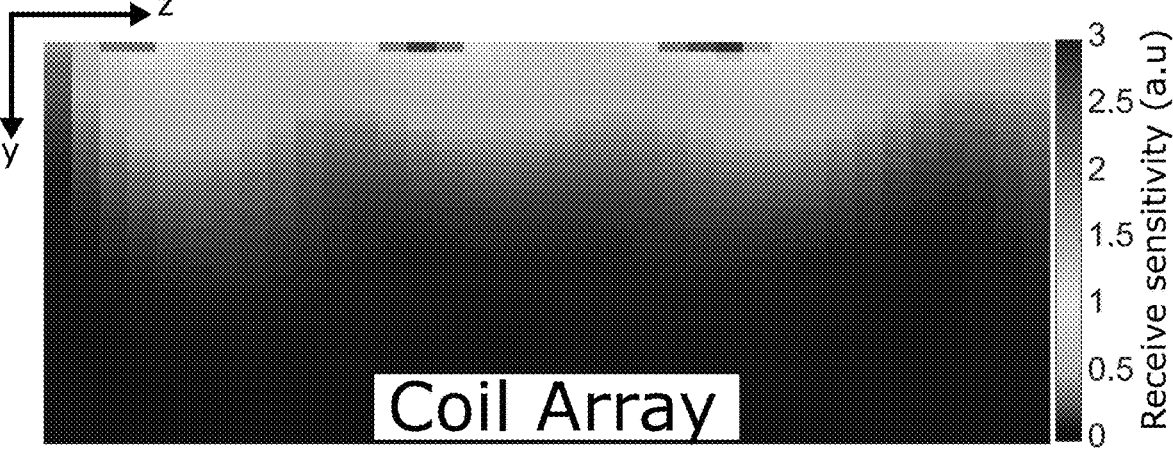
FIG. 19 is a graph displaying the receive sensitivity profile of a coil array.

Ports placed at various points on the MTM structure allow excitation of multiple current profiles on the structure and the signal from each port is combined for optimal SNR. In FIG. 12, a Metamaterial slab 40 is shown with 4 port 32 locations, combined with a coil array also with 4 ports. The Metamaterial slab 40 was compared by simulation (HFSS, Ansys) to that of a conventional 8-loop coil array covering the same area. It was determined that a similar combined receive sensitivity is obtained (FIGS. 18 and 19, 15A-16B) by the two arrays. FIGS. 18 and 19 show the combined receive sensitivity profiles in a phantom (sagittal slice). The impact on homogeneity and specific absorption rate with and without active detuning of the slab's resonance was explored and demonstrates that an improvement in transmit performance can be achieved without detuning, and that increasing the local specific absorption rate can be avoided. A metamaterial (MTM) slab may have improved receive sensitivity, for a reduced number of elements, compared to a conventional loop array. The following discussion demonstrates the design methods of an embodiment of the Metamaterial slab 40 and compares it with a loop receive array.

The excitation of the magnetic resonance signal (tipping longitudinal magnetization $-M_0$ to transverse magnetization $-M_{xy}$) is produced by right circularly polarized RF magnetic field $-B_1^+$.

The transverse magnetization $-M_{xy}$ induces a voltage in receive elements proportional to the left circularly polarized RF magnetic field $-B_1^-$ they would produce by reciprocity.

Figure 20:
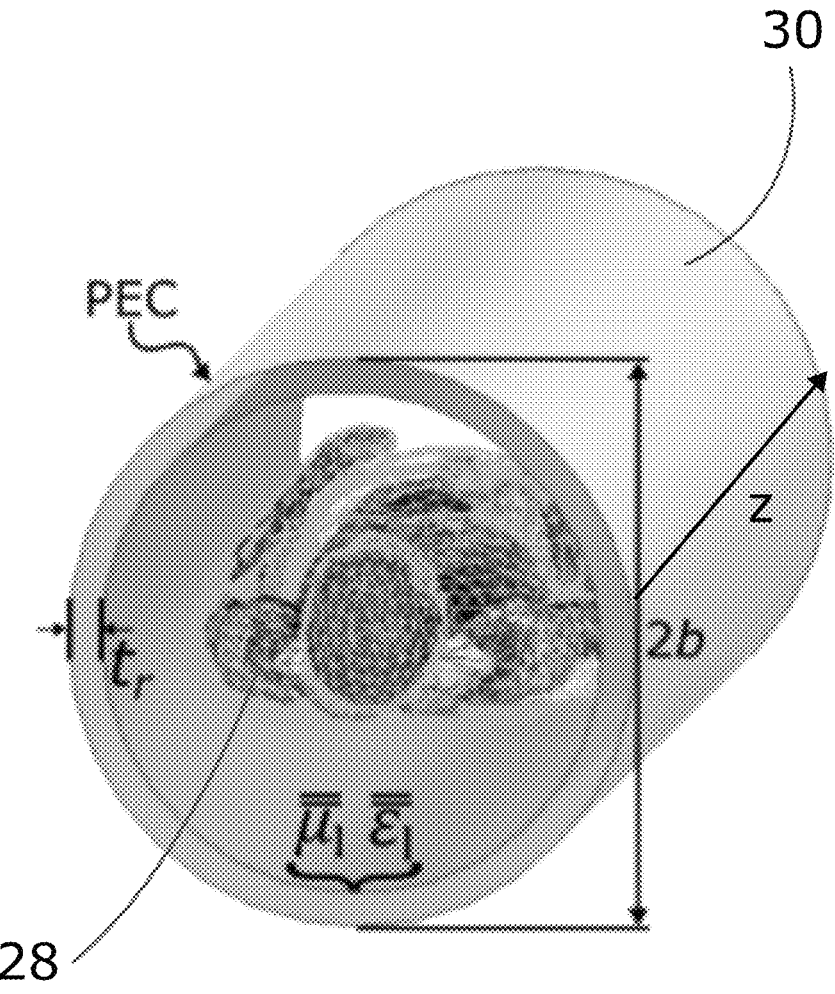
FIG. 20 is an isometric partial view of a model of a cylindrical waveguide formed using a metamaterial liner.
Figure 21:
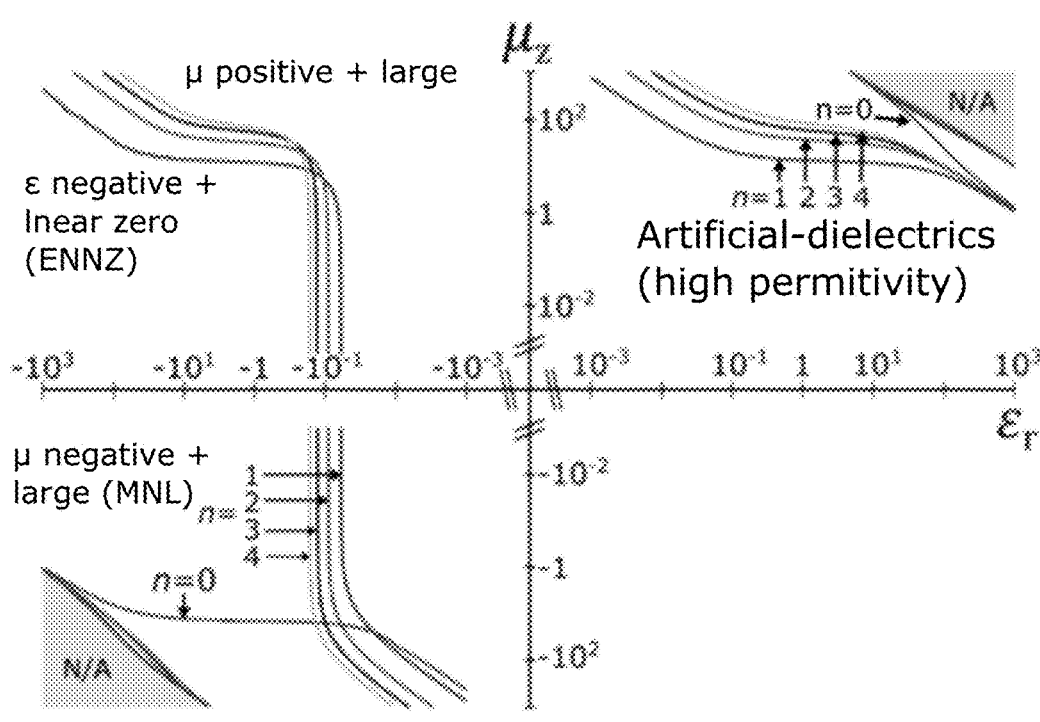
FIG. 21 is a chart of $HE_{n1}$ modes for different values of permittivity and permeability for the waveguide shown in FIG. 20.

FIGS. 20-21 illustrate a cylindrical wave guide, as used in a previous metamaterial liner used in travelling wave MRI. The corresponding equations are as follows:

$$\hat{r}, \hat{\phi}, \hat{Z}$$

$$\overline{\overline{\varepsilon_l}} = \varepsilon_0 I(\varepsilon_r, \varepsilon_r, 1)$$

$$\overline{\overline{\mu_l}} = \mu_0 I(1, 1, \mu_z)$$

$$\frac{J_n'(k_0 a)}{J_n(k_0 a)} - \frac{\sqrt{\mu_z}}{\sqrt{\varepsilon_r}} \frac{G_n'(k_0 \sqrt{\varepsilon_r \mu_z} \, a)}{G_n(k_0 \sqrt{\varepsilon_r \mu_z} \, a)} = 0$$

$$F_n(xa) = Y_n(xb)J_n(xa) - J_n(xb)Y_n(xa)$$

$$G_n(xa) = Y_n'(xb)J_n(xa) - J_n'(xb)Y_n(xa)$$

In FIG. 20, $t_r=1.1$ cm and b=28 cm. In FIG. 21, the $\mu_z$ and $\varepsilon_r$ correspond to $HE_{n1}$ modes with cut-off frequency of 200 MHZ.

Figure 22:
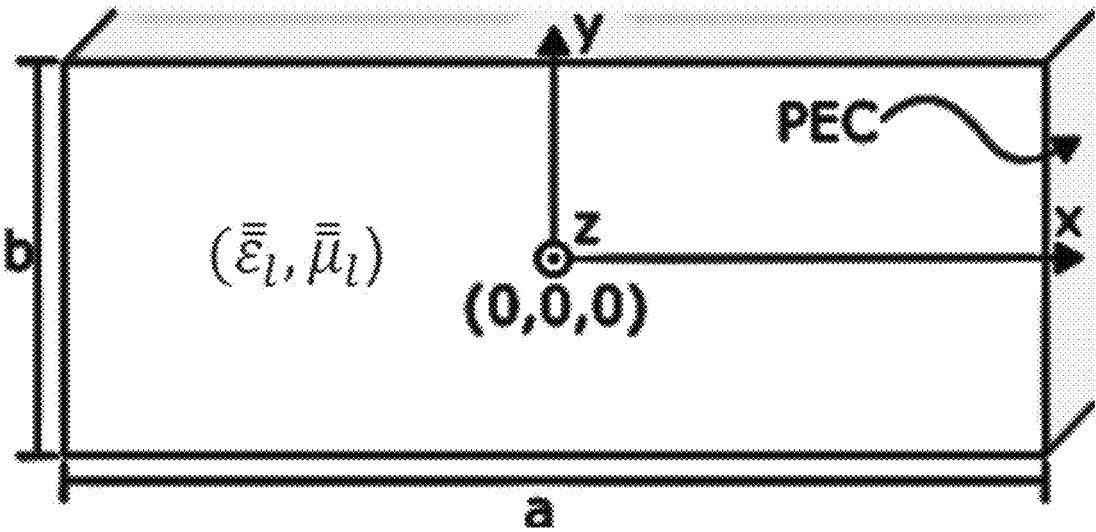
FIG. 22 is an isometric partial view of a model of a rectangular waveguide.
Figure 23:
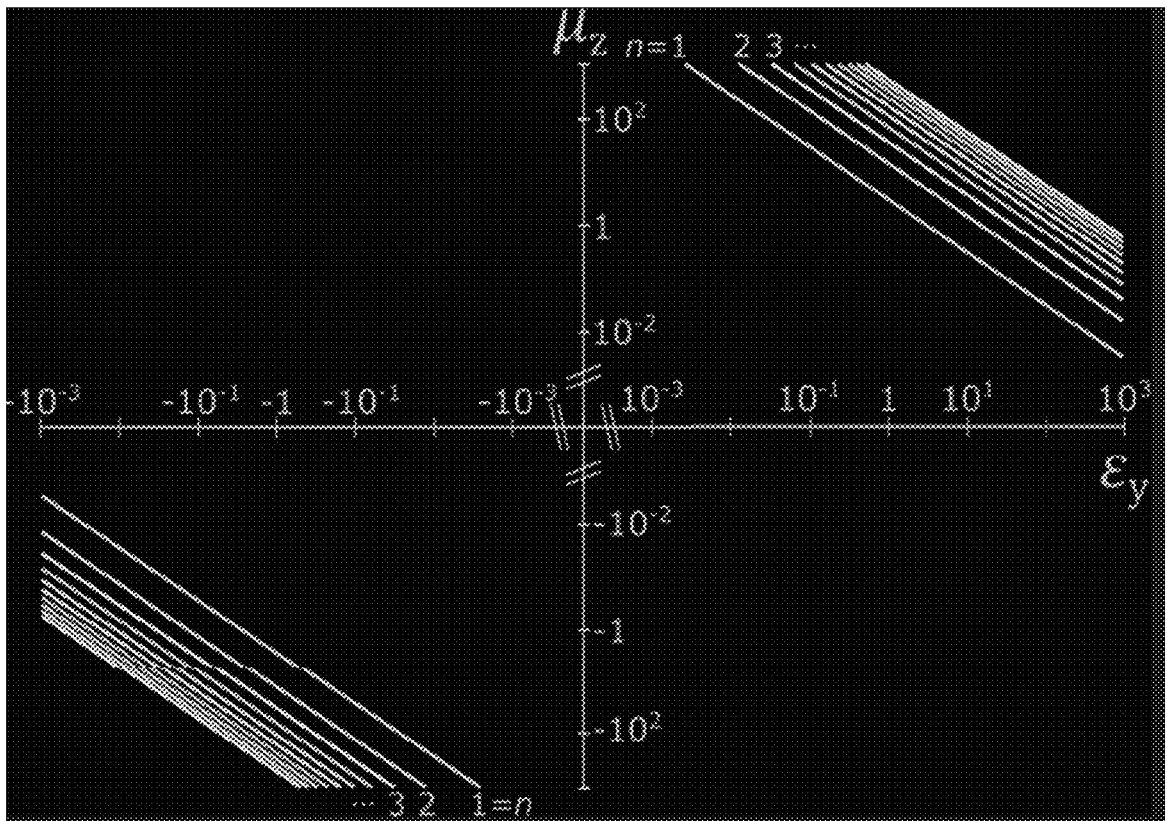
FIG. 23 is a chart of $HE_{n1}$ modes for different values of permittivity and permeability of the waveguide shown in FIG. 22.

FIGS. 22-23 illustrate a rectangular waveguide, as also analyzed in relation to travelling wave MRI. The corresponding dispersion relation equations are as follows:

$$\hat{x}, \hat{y}, \hat{Z}$$

$$\overline{\overline{\varepsilon_l}} = \varepsilon_0 I(1, \varepsilon_y, 1)$$

$$\overline{\overline{\mu_l}} = \mu_0 I(\mu_x, 1, \mu_z)$$

$$\mu_x \varepsilon_y \left( k_0^2 - \frac{k_x^2}{\mu_z \varepsilon_y} \right) = k_z^2$$

$$k_y = 0, k_x = n\pi/a$$

In FIG. 23, $\mu_z$ and $\varepsilon_y$ correspond to $HE_{n1}$ modes with cut-off frequency of 128 MHz. In FIG. 22, the dimensions are as follows: a=32 cm and b=2 cm.

Figure 24:
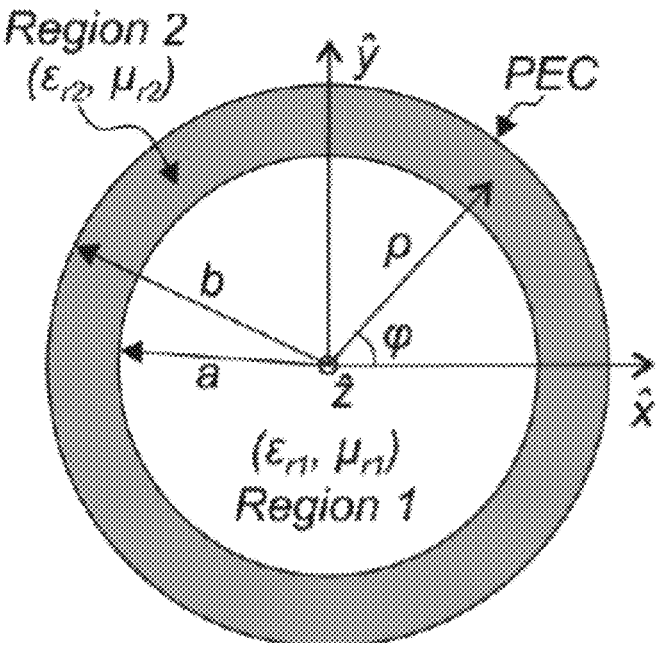
FIG. 24 is an axial-view cross section of a cylindrical metamaterial-lined waveguide.
Figure 25:
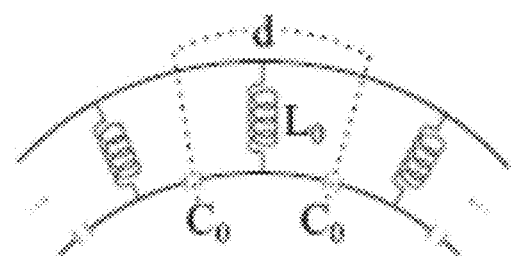
FIG. 25 is a partial model of an example metamaterial for the waveguide shown in FIG. 24.
Figure 26:
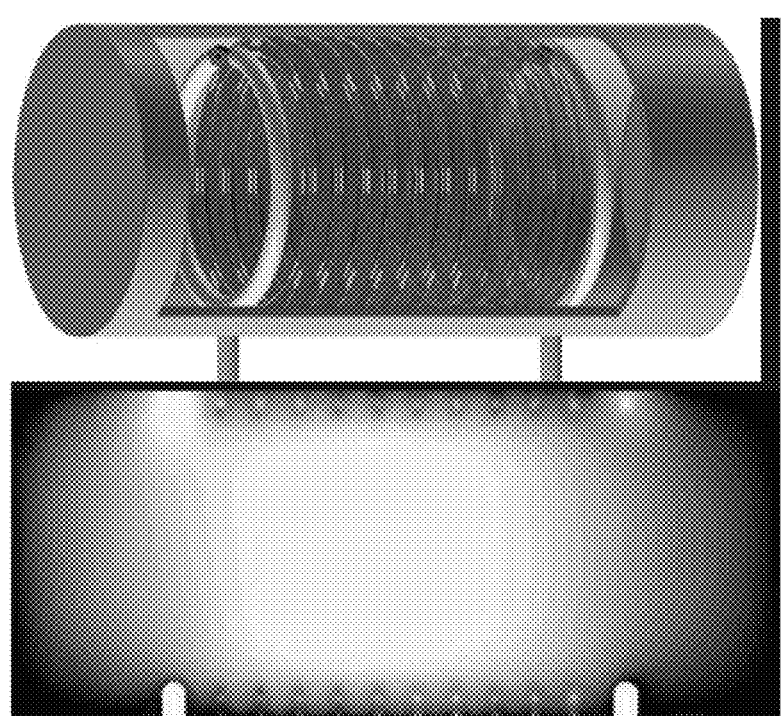
FIG. 26 is a side isometric view of the example metamaterial and cylindrical lined waveguide shown in FIG. 24 and a side view its E-field (electric field) in its first longitudinal resonance at 3.72 GHz.
Figure 27:
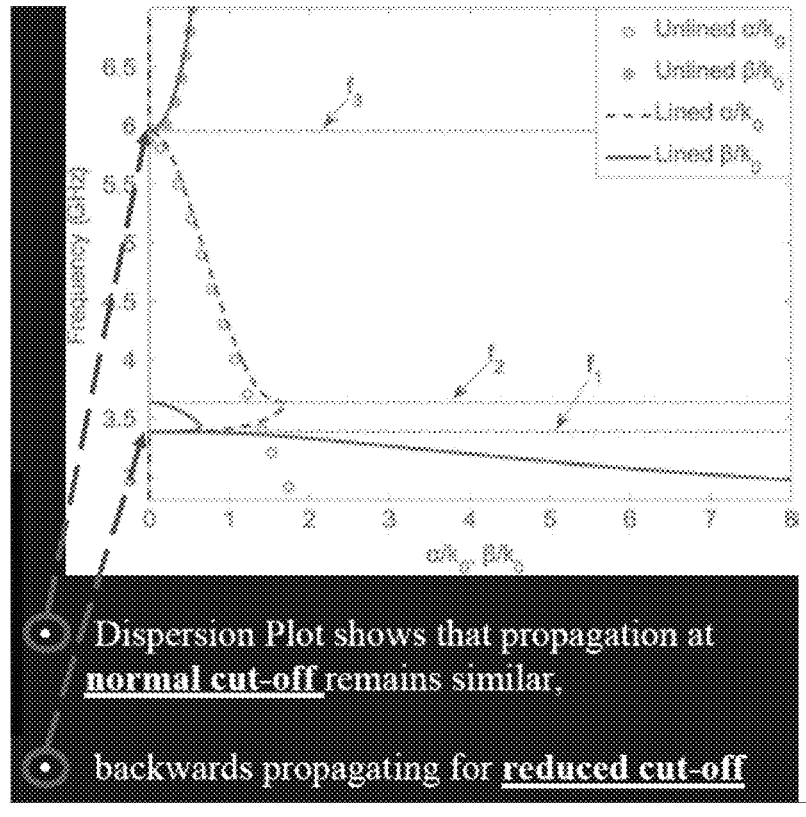
FIG. 27 is a dispersion plot for the waveguide shown in FIG. 26 and a corresponding unlined waveguide.

FIG. 24 schematically shows a cross section of a lined waveguide, such as shown in FIG. 20, lined with an metamaterial liner. FIG. 25 shows a possible implementation of a liner as shown in FIG. 24, using radial inductors. This typically uses a different unit cell than the MTM liner illustrated in FIG. 10. FIG. 26 shows E-field (electric field) first longitudinal resonance (3.72 GHz). FIG. 27 is a dispersion plot for the waveguide shown in FIG. 26 and a corresponding unlined waveguide.

Figures 5, 6:
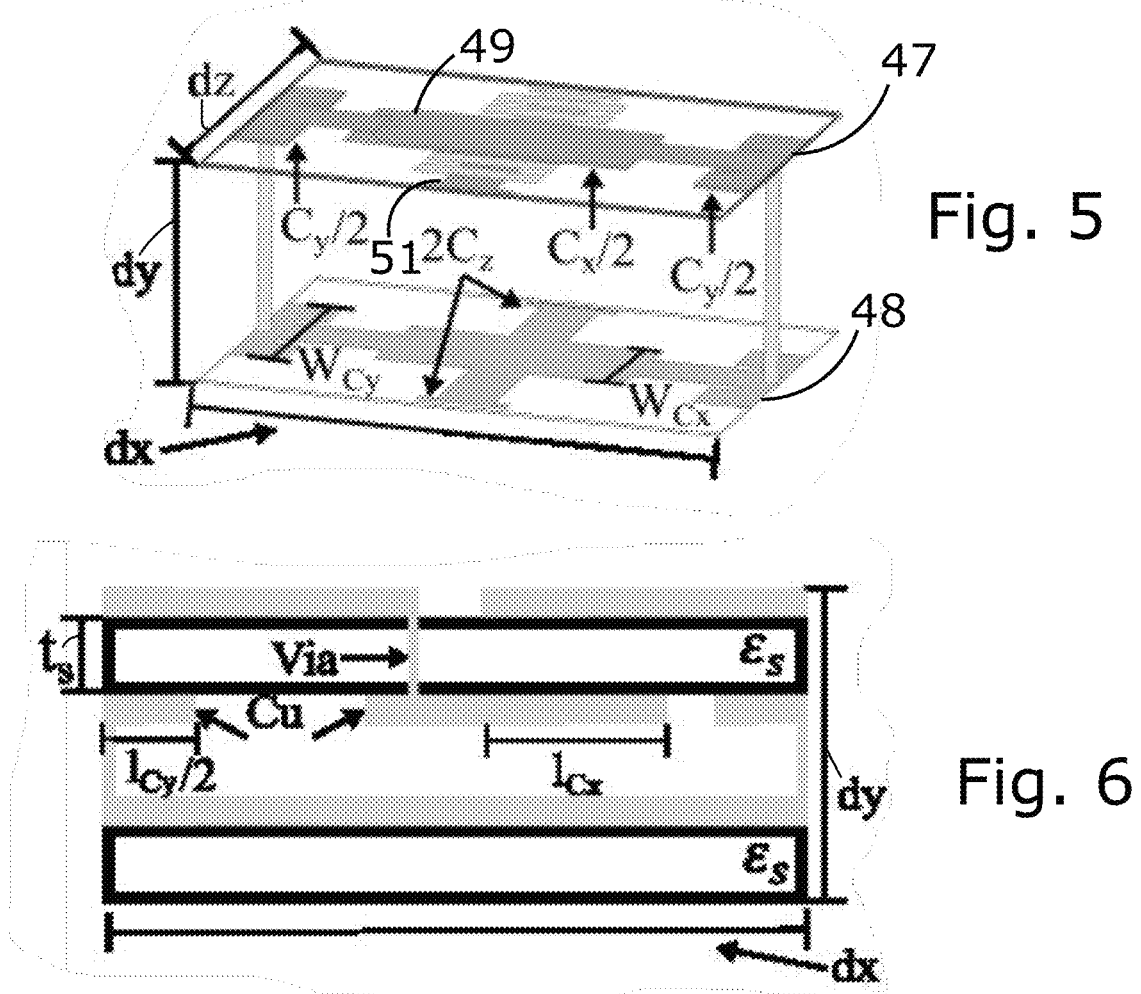
FIG. 5 shows an isometric view of an embodiment of a model of an MTM unit cell.
FIG. 6 shows a side cross section view of the embodiment shown in FIG. 5.
Figures 9, 10:
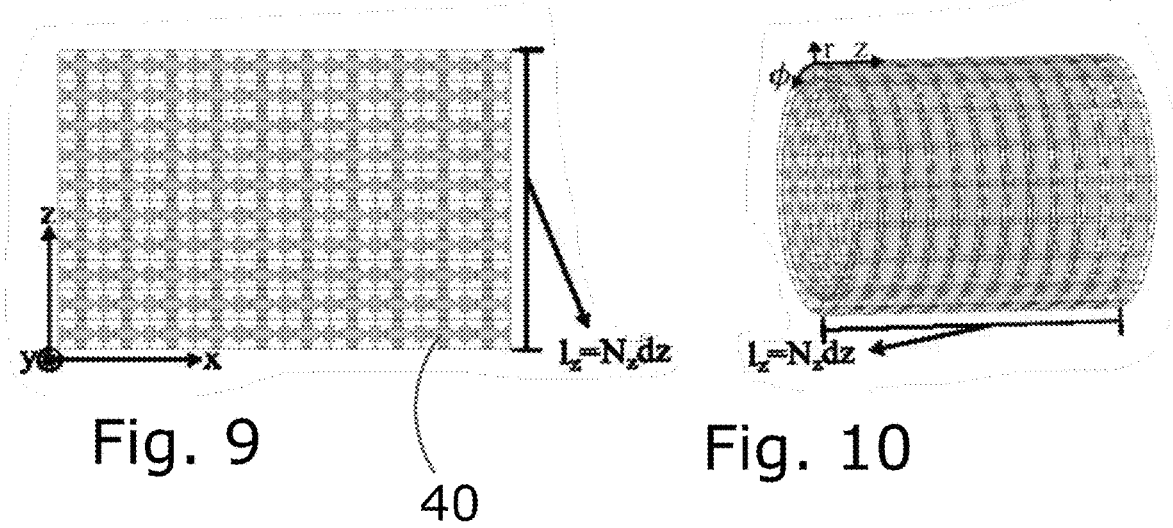
FIG. 9 shows a simulation model of an embodiment of a rectangular MTM slab made up of rows of the rectangular array shown in FIG. 7.
FIG. 10 shows a simulation model of an embodiment of a cylindrical MTM liner made up of rows of the circular array shown in FIG. 8.

FIGS. 5 and 6 illustrate an example unit cell for a metamaterial, which may be provided in an arrangement for an MTM slab for example as shown in FIG. 9, or an MTM liner for example as shown in FIG. 10. In an example embodiment illustrated by FIGS. 5 and 6, the dimensions are as follows: dz=32 mm, dx=45.7 mm, dy=20 mm, $\lambda_0$ (128 MHz)=2.34 m. In FIG. 10, for a rectangular slab, $k_x N_x d_x = \pi n_x$, $n_x = 1, 2, 3 \ldots$.

The unit cell in an embodiment consists of a 3D arrangement of conductors (e.g., Copper, silver) forming connected (though perhaps only via capacitance) loops in at least three directions. This embodiment forms two layers of conductors, but could involve multiple layers in the same direction.

The conductors of each unit cell, in all three directions, can be broken up by lumped or intrinsic capacitive or inductive elements that when properly chosen produce the resonant response and electromagnetic propagation characteristics desired for MRI transmission enhancement and resonance receive sensitivity profile, which are two separate but inter-related characteristics of the full metamaterial slab.

This embodiment of the metamaterial slab employs a structure that is anisotropic. The top layer of conductor consists of strips of series lumped capacitive elements made up from conductors overlaid (Cz) (with some distributed inductance) on a laminate substrate ($\varepsilon$s). The conductors are laid on both sides of the substrate and a capacitive bridge between conductors (separated by the substrate thickness) via the distributed capacitance between parallel conductive strips is formed. Lumped capacitive breaks formed by conductor overlaid on laminate (Cy) are connected to the conductor of the opposite plane via conductors (length of dy). In this embodiment the in strips parallel to the top layer conductor do not have capacitive breaks. The strips couple capacitively, as well as through magnetic induction (mutual inductance), between adjacent unit-cell separated by dx.

In other embodiments the strips could be joined electrically by lumped capacitive elements, lumped inductances or with small conductive traces. The two planes could be joined by lumped inductors or small conductive traces and the bottom conductors could be separated by lumped inductors or capacitors rather than just electrical traces. Different arrangements of the impedances could also be used.

The unit cell of this embodiment of the metamaterial slab differs from the metamaterial liner in which the outer conductive shield of the MRI would typically represent the conductors in at least one plane of the 3D unit cell, and would typically not be broken up (a solid ground conductor plane common to all the cells). This shield will typically prevent fields from being produced outside or penetrating the shield. Furthermore, the metamaterial liner would typically be an enclosing structure that is periodically joined in one dimension (the last unit cell in the full structure is electrically connected to the first unit cell in the azimuthal dimension).

The effective permeability and permittivity of the metamaterial slab is characterized by the induced or scattered electric and magnetic fields produced by the structure due to an impinging field and the corresponding constitutive relations (effective medium permittivity c and permeability µ parameters).

Figure 59:
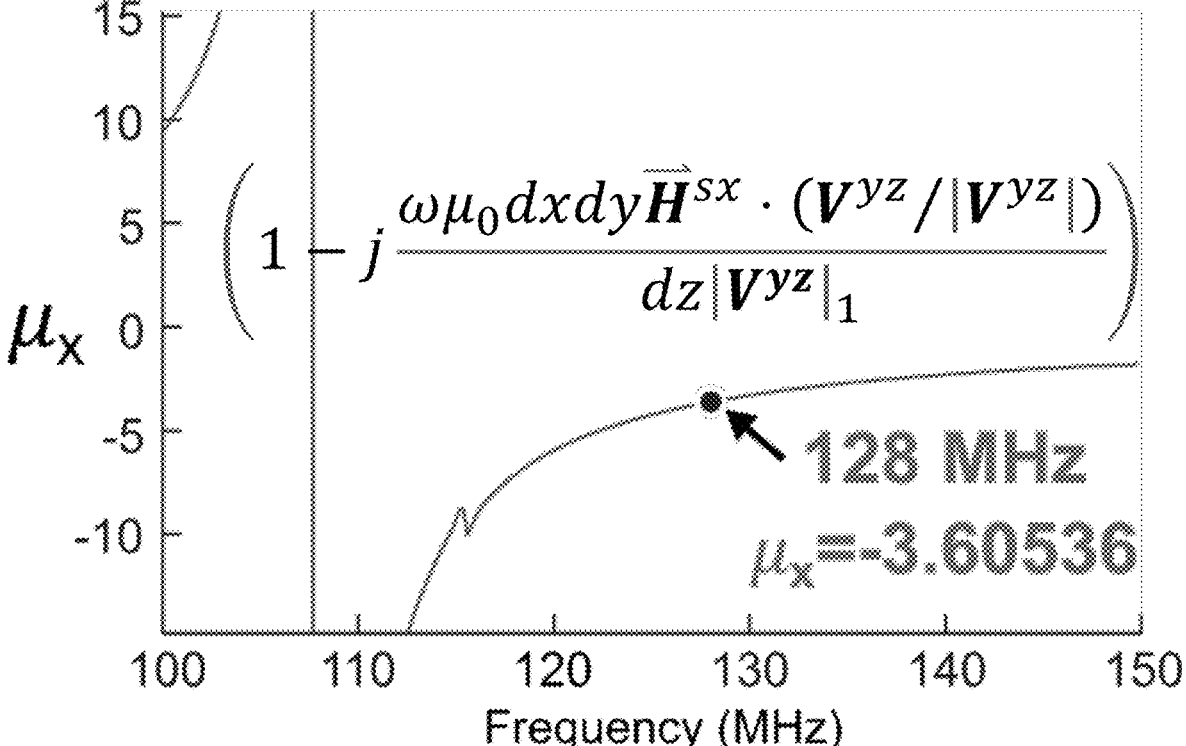
FIG. 59 shows a graph of the results of the permeability of the model in FIG. 1.

The response of the metamaterial slab to the $TE_{11}$ excitation profile of a circular waveguide encompassing the slab was used to derive the anisotropic effective medium parameters via a circuit model. A $TE_{11}$ excitation emulates an ideal birdcage excitation. The derived value for the most relevant effective medium parameter ($\mu_x$) is shown in FIG. 59. This metamaterial has a negative magnetic response, primarily to one direction, at 128 MHz. In simulation, the inventors designed a slab of material with the derived anisotropic medium parameters of the metamaterial slab and determine the fields. This derivation and simulation method gives an idea of how the structure can be tuned to optimize the effective medium for homogeneity. In particular, it could be optimized by varying the material parameters via tuning of the circuit parameters, determining which parameter values provide best homogeneity, tuning the slab to achieve those parameter values according to circuit derivation, and ensuring the fields of the material with effective medium and actual slabs are close.

Figure 7:
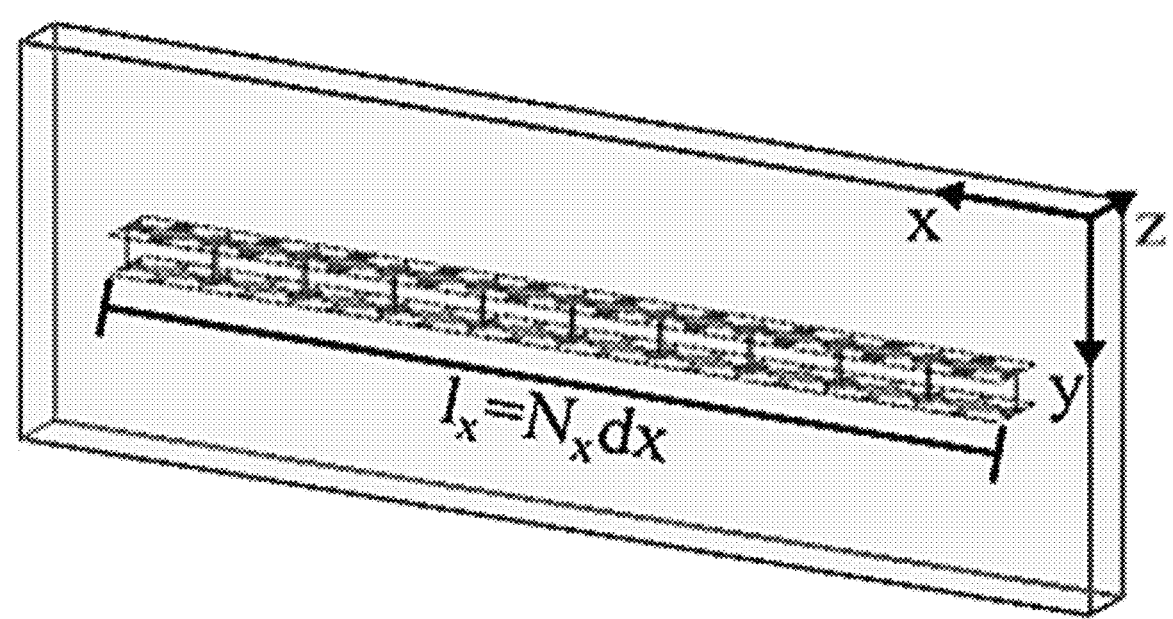
FIG. 7 shows an isometric view of an x-direction array made up of an MTM unit cell.
Figure 28:
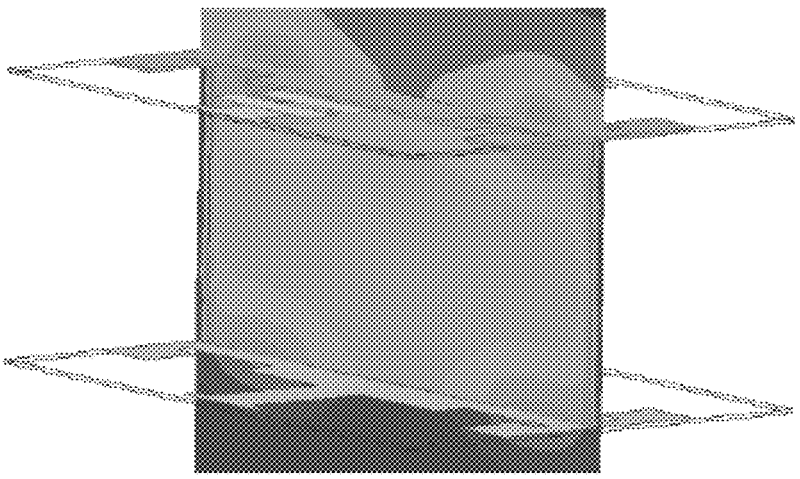
FIG. 28 shows an isometric view of the H-field of an MTM unit cell in $HE_{12}$ mode.
Figure 29:
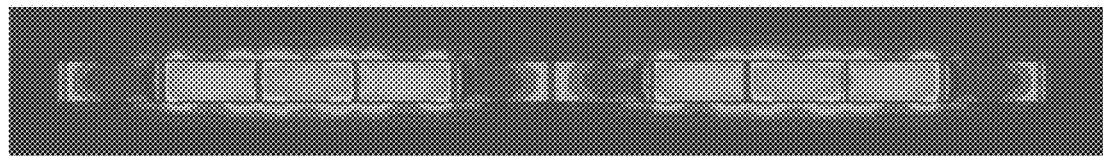
FIG. 29 shows a side view of the H-field for the linear array of MTM unit cells shown in FIG. 7.
Figure 30:
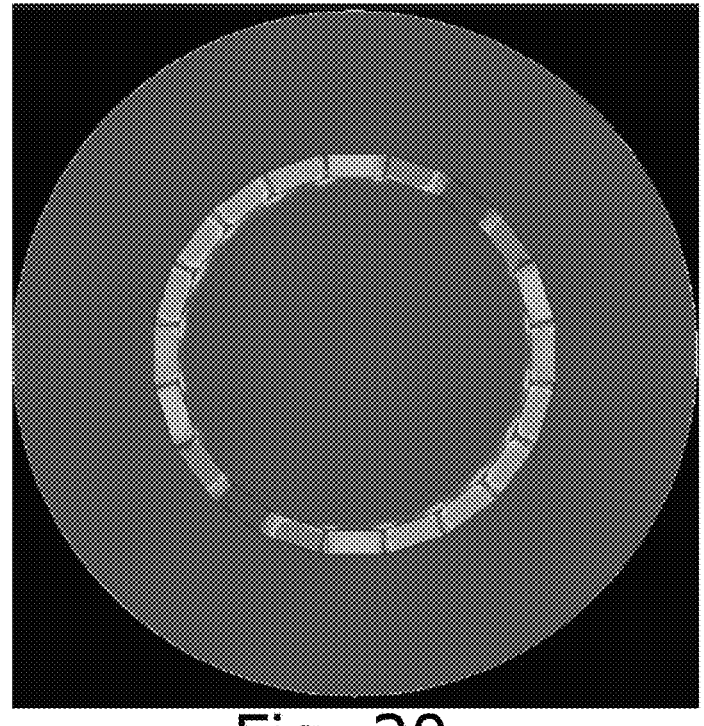
FIG. 30 shows an axial view of the H-field of the array in FIG. 8.

FIGS. 28, 29 and 30 illustrate eigenmode simulations. FIG. 28 shows the $HE_{12}$ mode—H-field for a unit cell corresponding to the FIG. 2 model. FIG. 29 shows the $HE_{12}$ mode—H-field for a linear array of unit cells corresponding to the FIG. 7 model. FIG. 7 shows the unit cells depicted in FIG. 2 arranged in a series. The field confinement in liner region: operation for MRI is similar to leaky-wave waveguides/antennas. FIG. 29 illustrates an eigenmode simulation and FIG. 30 illustrates the eigenmode simulations for a cylindrical array of unit cells. FIG. 30 shows the $HE_{11}$ mode—H field for a cylindrical array of unit cells corresponding to the FIG. 8 model.

Figure 32:
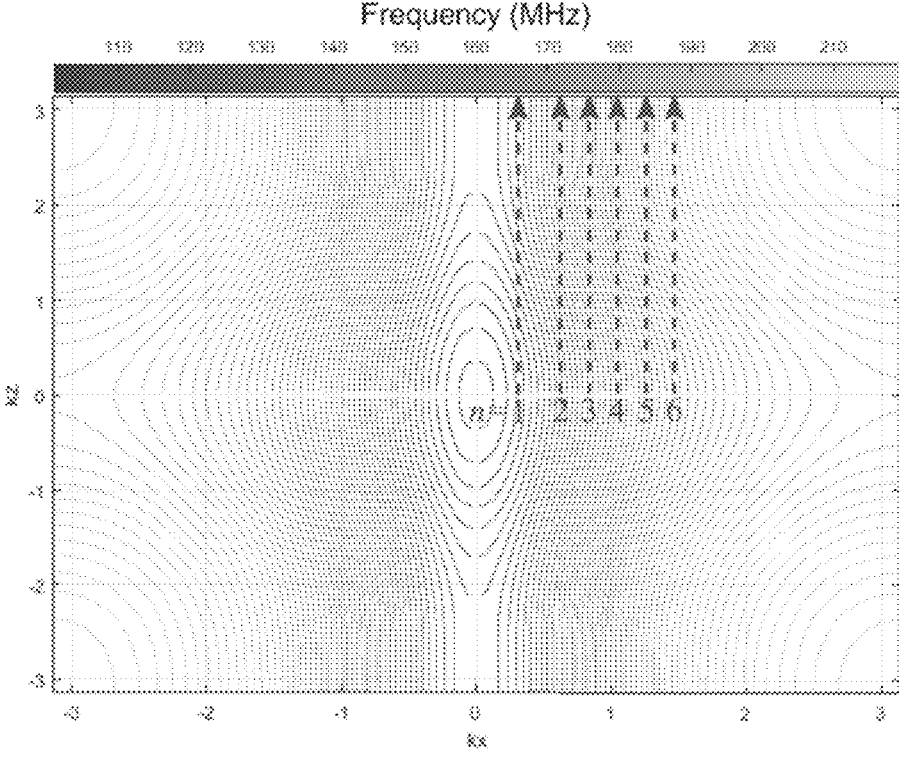
FIG. 32 shows a graph of a result showing 2D dispersion relations for different frequencies for a rectangular slab formed of plural of the MTM arrays shown in FIG. 7.
Figure 33:
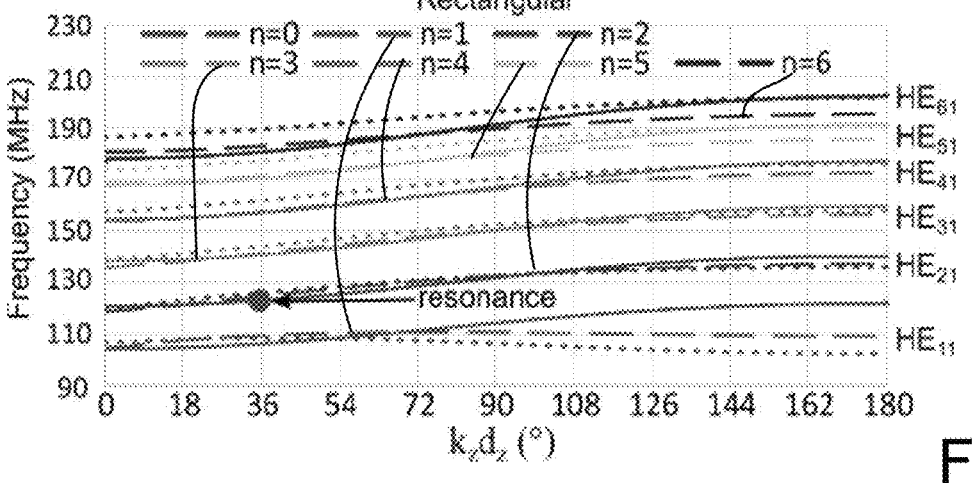
FIG. 33 shows a graph of a result showing the dispersion relations of different longitudinal modes for the slab shown in FIG. 9.

FIGS. 32 and 33 illustrate MTM slab dispersion for a rectangular case. In FIG. 9 a rectangular slab is formed as a rectangular array of MTM unit cells, $k_x N_x d_x = \pi n_x$, $n_x=1, 2, 3 \ldots$, where $N_x$ is a number of rows of unit cells.

Figure 34:
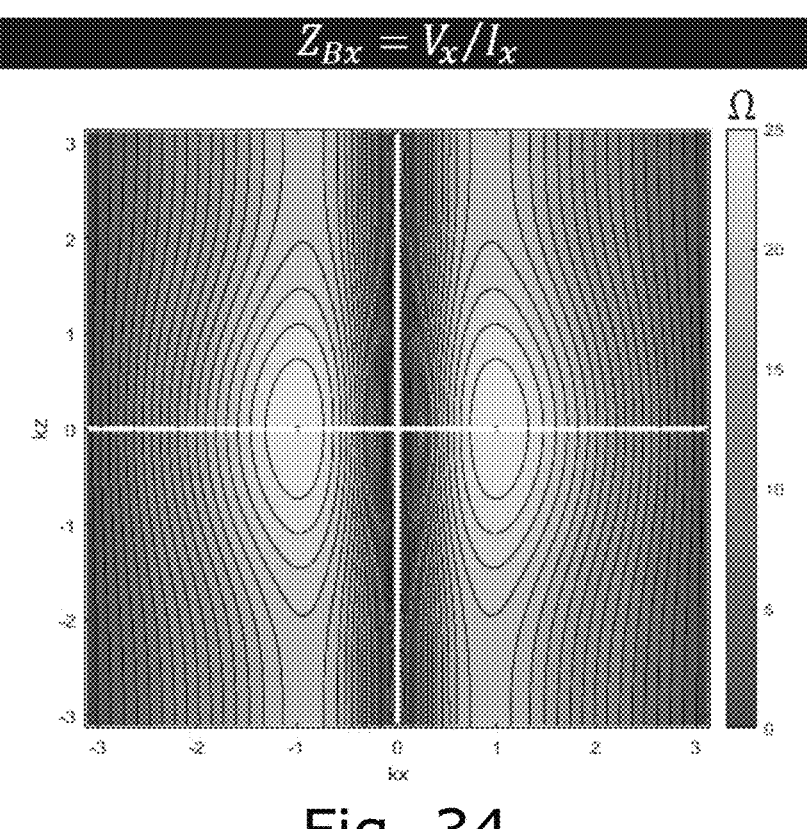
FIG. 34 shows a graph of the results of the Bloch impedances for the rectangular MTM slab.
Figure 35:
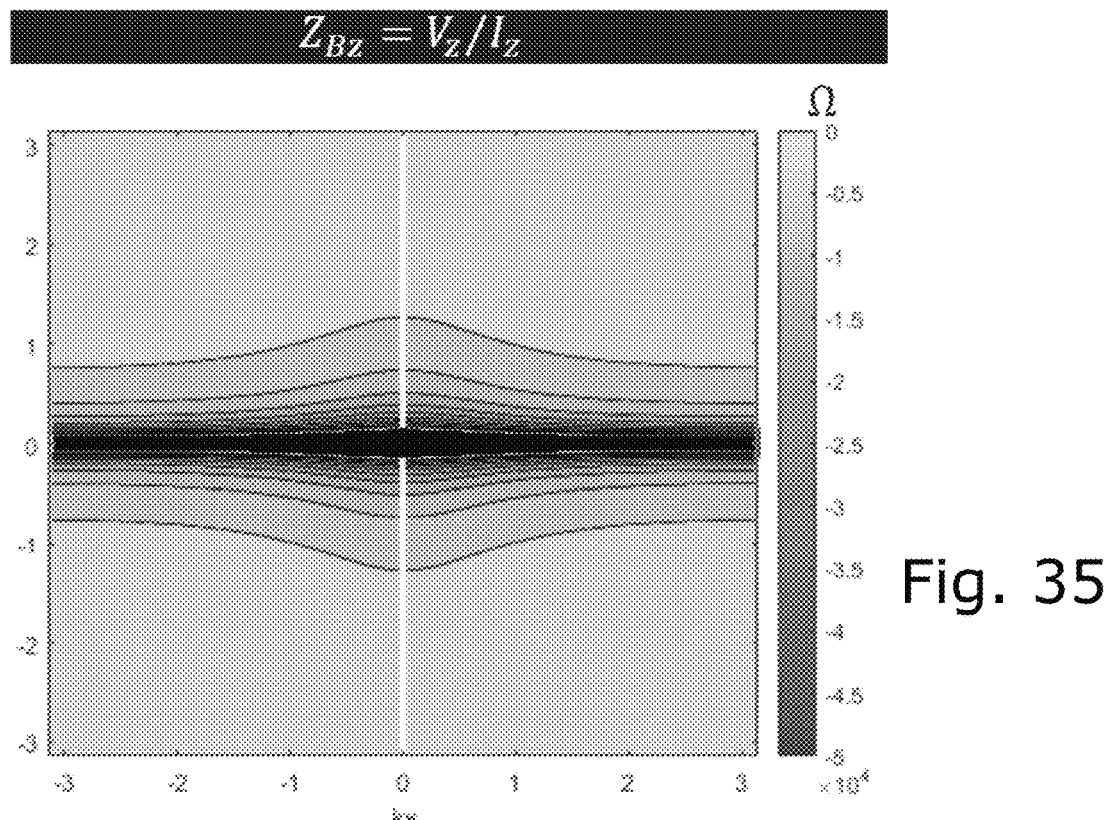
FIG. 35 shows a graph of the results of the Bloch impedances for the rectangular MTM slab shown in FIG. 9.

FIGS. 34-35 illustrate the MTM liner Bloch impedances for a rectangular case.

FIG. 38 illustrates the effective medium approximation for a rectangular case of the MTM structure. The infinite conducting sheet approximation is used and homogenization is applied. The corresponding equations are as follows:

$$\sqrt{\frac{\mu_z \mu_0}{\varepsilon_y \varepsilon_0}} = \frac{E_y}{H_z} = \frac{V_x/d_y}{I_x/d_z} = \frac{Z_{Bx} d_z}{d_y}$$

$$\sqrt{\frac{\mu_x \mu_0}{\varepsilon_y \varepsilon_0}} = \frac{E_y}{H_x} = \frac{V_z/d_y}{I_z/d_x} = \frac{Z_{Bz} d_x}{d_y}$$

$$k_0^2 = \frac{k_z^2}{\mu_x \varepsilon_y} + \frac{k_x^2}{\mu_z \varepsilon_y}$$

$$\varepsilon_y = \pm \frac{1}{\varepsilon_0 \omega} \sqrt{\left(\frac{k_z d_y}{Z_{Bz} d_x}\right)^2 + \left(\frac{k_x d_y}{Z_{Bx} d_z}\right)^2}$$

$$\mu_z = \left(\frac{Z_{Bx} d_z}{d_y}\right)^2 \frac{\varepsilon_y \varepsilon_0}{\mu_0}$$

$$\mu_x = \left(\frac{Z_{Bz} d_x}{d_y}\right)^2 \frac{\varepsilon_y \varepsilon_0}{\mu_0}$$

Figure 40:
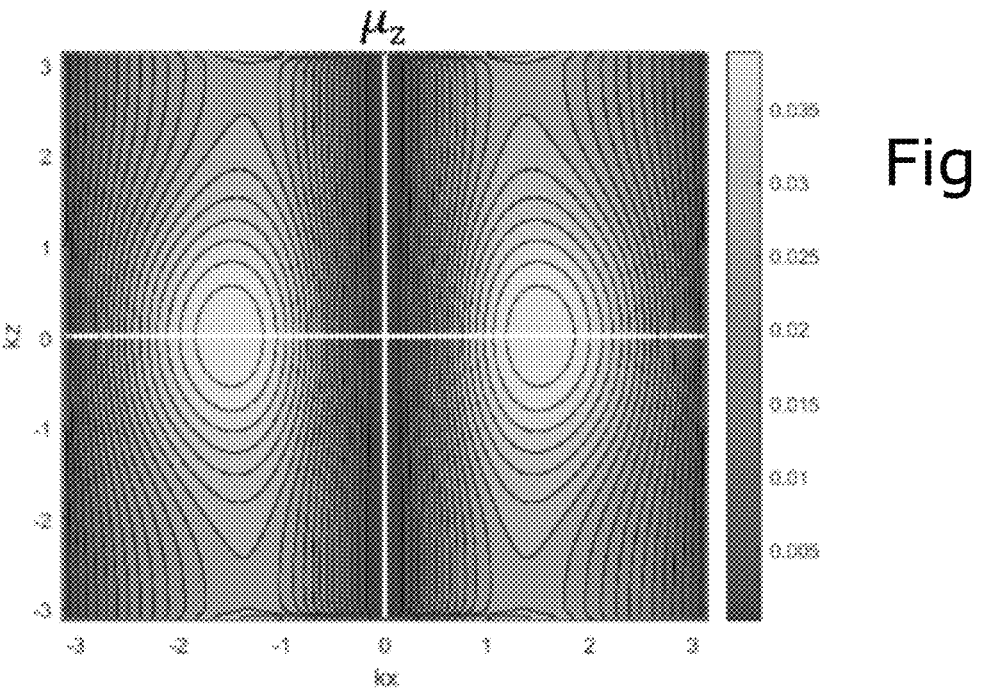
FIG. 40 shows the z-direction permeability for the effective medium approximation for a rectangular MTM slab shown in FIG. 9.
Figure 41:
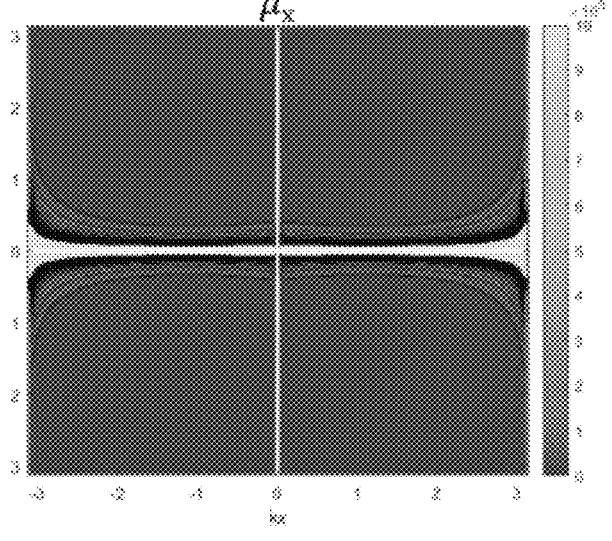
FIG. 41 shows the x-direction permeability for the effective medium approximation for a rectangular MTM slab shown in FIG. 9.

FIGS. 39-41 illustrate an MTM structure effective medium approximation for a rectangular case. The corresponding equations are as follows:

$$\varepsilon_y = \pm \frac{1}{\varepsilon_0 \omega} \sqrt{\left(\frac{k_z d_y}{Z_{Bz} d_x}\right)^2 + \left(\frac{k_x d_y}{Z_{Bx} d_z}\right)^2}$$

$$\mu_x = \left(\frac{Z_{Bz} d_x}{d_y}\right)^2 \frac{\varepsilon_y \varepsilon_0}{\mu_0}$$

$$\mu_z = \left(\frac{Z_{Bx} d_z}{d_y}\right)^2 \frac{\varepsilon_y \varepsilon_0}{\mu_0}$$

The propagation is facilitated by inductive coupling+ highly anisotropic unit-cell: non-local constitutive parameters.

Figure 42:
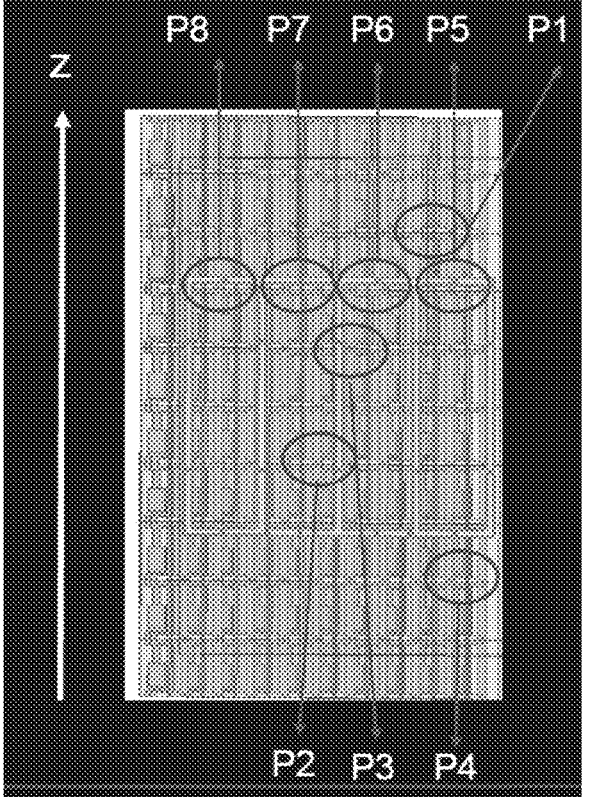
FIG. 42 shows a top view of a model showing ports where a transmit signal port excitation is connected for full-wave simulations for the MTM slab shown in FIG. 9.
Figure 43:
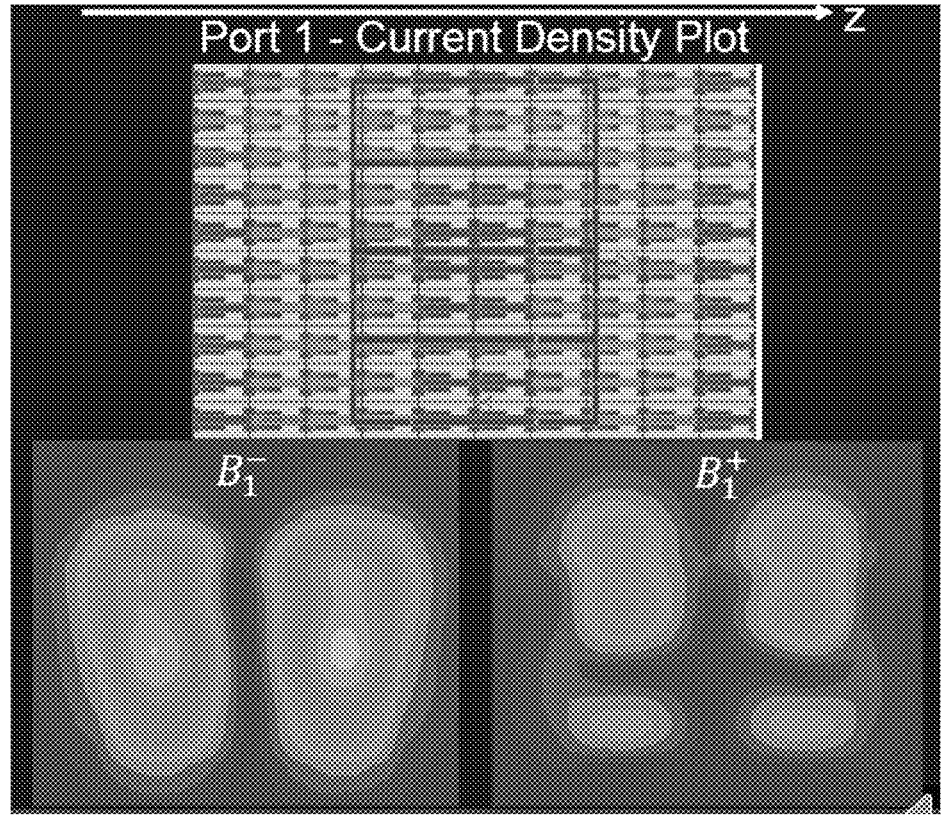
FIG. 43 shows the current density plot, and resulting magnetic field patterns, for current introduced on port 1 of the MTM slab shown in FIG. 42.

FIGS. 42-43 illustrate full wave simulations. The positive and negative components of the radio frequency magnetic fields ($B_1$) are shown. FIG. 42 represents an MTM slab with a companion array for which the full wave simulations were produced and shows ports P1-P8.

Figure 44:
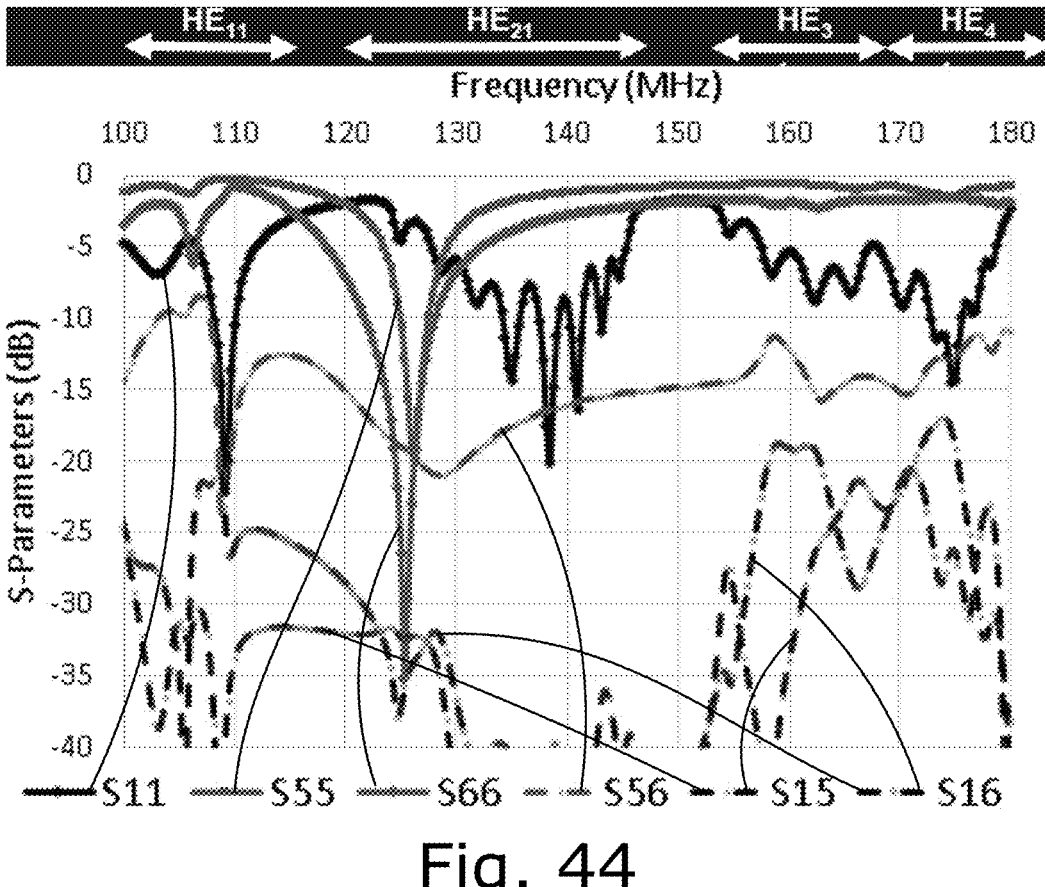
FIG. 44 shows a chart of the frequencies and S-parameters of different ports and conventional receive coil shown in FIG. 42.

FIG. 44 illustrates S-parameters in relation to frequency as found by the full wave simulations. The characteristic impedance was normalized to the real part of input impedance at 128 MHz.

Figure 45:
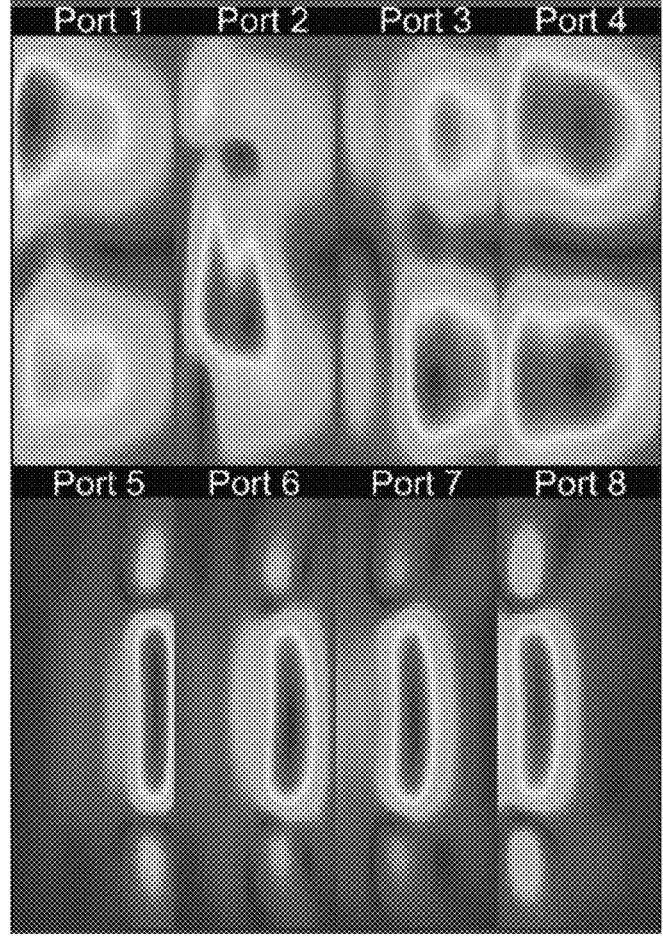
FIG. 45 shows a chart of the receive sensitivities (the B1− fields produced per unit current)) produced by the ports for the MTM liner and conventional receive coil array shown in FIG. 42 determined by the full wave simulations.

FIG. 45 illustrates port sensitivities found via the full wave simulations. The ports are indicated by Port 1 to Port 8.

Figures 46A, 46B, 46C, 47A, 47B, 47C:
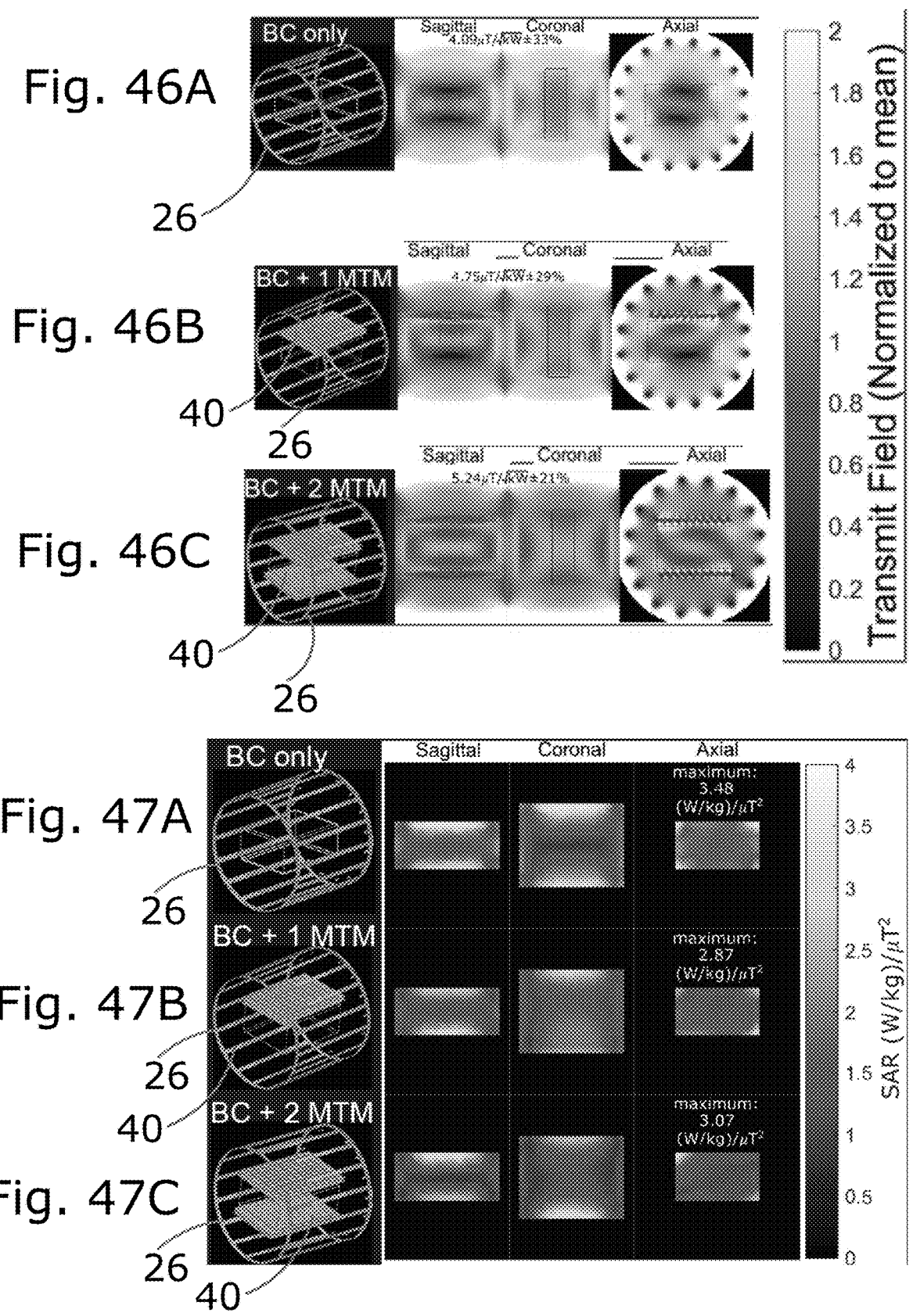
FIG. 46A shows an isometric view of a model of a BC alone (shown on the far left) and charts of its associated transmit field results for sagittal, coronal, and axial view (shown from left to right, respectively).
FIG. 46B shows an isometric view of an embodiment of a MTM slab and a BC (shown on the far left) and charts of its associated transmit field results for sagittal, coronal, and axial view (shown from left to right, respectively).
FIG. 46C shows an isometric view of an embodiment of two MTM slabs and a BC (shown on the far left) and charts of its associated transmit field results for sagittal, coronal, and axial view (shown from left to right, respectively).
FIG. 47A shows an isometric view of a BC and charts of its associated SAR results for sagittal, coronal, and axial view (shown from left to right, respectively).
FIG. 47B shows an isometric view of an embodiment of a BC and an MTM slab and charts of its associated SAR results for sagittal, coronal, and axial view (shown from left to right, respectively).
FIG. 47C shows an isometric view of an embodiment of a BC and two MTM slabs and charts of its associated SAR results for sagittal, coronal, and axial view (shown from left to right, respectively).

FIGS. 46A-46C illustrate transmit efficiency found via the full wave simulations. The mean transmit efficiency increased by 28%. The homogeneity improved from 33% to 21%. These comparisons are between the BC only and BC+2MTM simulations.

FIGS. 47A-47C illustrate the specific absorption ration (SAR) found via the full wave simulations. They are maximum intensity projection plots. The 10 g local SAR, normalized for transmit field, was reduced by 12%. This comparison was between the BC (birdcage coil) only and the BC+2MTM simulations.

FIGS. 48A-48B illustrates application to MRI, namely, Rx (receive) Sensitivity for an MTM array vs. conventional array. FIG. 48A shows the MTM slab and 4 element array and FIG. 48B shows the corresponding receive sensitivity. FIG. 49A shows the conventional 8 element array and FIG. 49B shows the corresponding receive sensitivity. The corresponding equation for the signal to noise ratio (SNR) of the combined image is as follows:

$$SNR = \frac{w\hat{B}_1^-}{\sqrt{w\Psi^{-1}w^H}},$$

$$w = \Psi^{-1}\hat{B}_1^-$$

$$\Psi = R(Z)$$

where $\Psi$ is the covariance matrix of the thermal noise.

Figure 8:
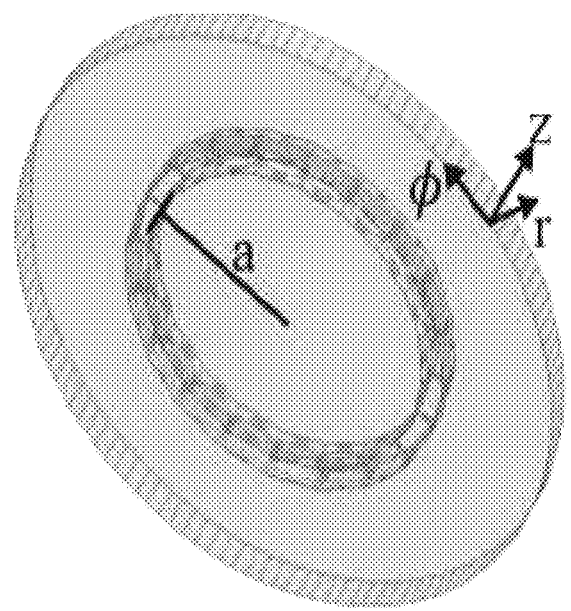
FIG. 8 shows an isometric view of a cylindrical array in the x-direction of the unit cell in FIG. 6 for a simulation model.

An embodiment of a metamaterial unit cell consists of two transversely oriented conductors with series capacitors and capacitive and/or inductive elements between conductors. The layer view and labelled MTM unit-cell simulation model are shown in FIGS. 6 and 5, respectively. Eigenmode simulations (HFSS, ANSYS) were performed to analyze the dispersion of the MTM liner. In the simulation, periodic boundaries were on the xy- and yz-plane face boundaries. Eigenmode simulations were also performed on a finite-sized rectangular strip ($N_x$=10 unit cells) and a cylindrical ring ($N_\theta$ unit cells, radius a=dx/2 sin($\pi$/$N_\theta$)) connected as shown in FIGS. 7 and 8, respectively. To be sensitive to or excite the magnetic resonance the coils must produce a magnetic field ($B_1$) transverse to the static magnetic field ($B_0\hat{Z}$). The rectangular liner is designed to produce a quadrupole excitation, so it would be naturally decoupled from the transmit coil, while the cylindrical liner is designed to produce a homogenous transverse field at the center. The simulated dispersion of the single unit cell closely matches those of models in FIGS. 7 and 8 when:

$$k_x N_x d_x = \pi n_x, \; n_x = 1, 2, 3 \ldots, \text{ for rectangular slab,}$$

$$k_\phi N_\phi d_\phi = 2\pi n_\phi, \; n_\phi = 1, 2, 3, \ldots, \text{ for cylindrical liner.}$$

The mode orders correspond to those of the hybrid electric (HE) modes for rectangular and cylindrical waveguides, respectively. FIGS. 9 and 10 show the complete resonators made up of the unit cells. These resonators are analogues of those waveguide structures. In an example embodiment, the geometric parameters were tuned so $N_z k_z d_z = 2\pi$ and $\pi$ at 128 MHz for the rectangular and cylindrical liners, respectively. Example parameters for the rectangular: $W_{C_y}$=16 mm, $l_{C_y}$=10 mm, $l_{C_z}$=22 mm. For the cylindrical: $W_{C_y}$=6 mm, $l_{C_y}$=4 mm, $l_{C_x}$=32 mm. For both: $W_{C_x}$=10 mm, $\epsilon_s$=6.15, $t_s$=0.25 mm.

FIG. 5 shows an embodiment of an MTM unit cell with labelled dimensions. FIG. 6 shows a simulation model layer view of the embodiment shown in FIG. 5.

FIGS. 7 and 8 illustrate the MTM liner simulation models (rectangular in FIG. 7 and cylindrical in FIG. 8) with finite extent in x-direction.

FIGS. 9 and 10 show the simulation models of the complete MTM-liner resonators.

The transmission network shown in FIG. 2 models the MTM unit cell, and illustrates an MTM slab Bloch transmission analysis. The corresponding data is as follows: $C_y$=28 pF, $C_x$=43 pF, $L_x$=50 nH, $L_y$=12 nH, $K_{01}$=−0.10, $K_{02}$=−0.02, $K_{11}$=0.015. $C_z$=0.2 pF and $C_{yd}$=0.11 pF are negligible at 128 MHz. The z-direction propagation is dominated by inductive coupling. The dispersion is calculated similarly to that in A. Grbic and G. V. Eleftheriades, "Periodic analysis of a 2-D negative refractive index transmission line structure," IEEE Transactions on Antennas and Propagation, vol. 51, (10), pp. 2604-2611, 2003. The voltage, $V_m$, characterizes the mutual inductance coupling between unit cells and is given by:

$$V_m = I_z jwL_x \Sigma(K_{n_x n_z} \cos n_x k_x d_x \cos n_z k_z d_z) \quad (2)$$

where only a few of the largest coupling coefficients, $K_{n_x n_z}$, were included and the rest set to zero.

Figure 37:
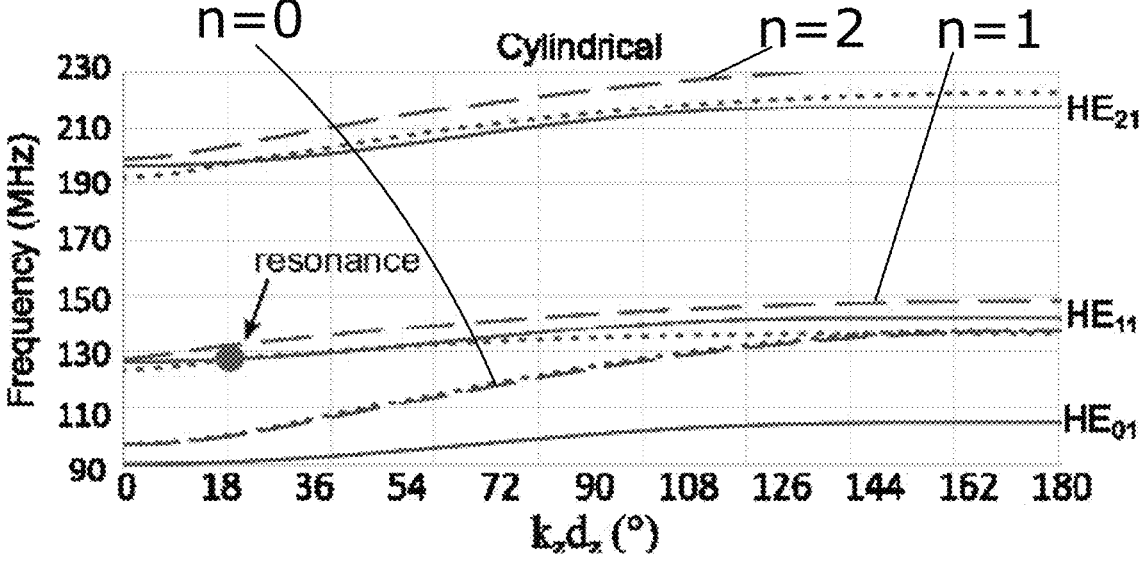
FIG. 37 is a chart showing simulated dispersion curves for the liner shown in FIG. 10.
Figure 50:
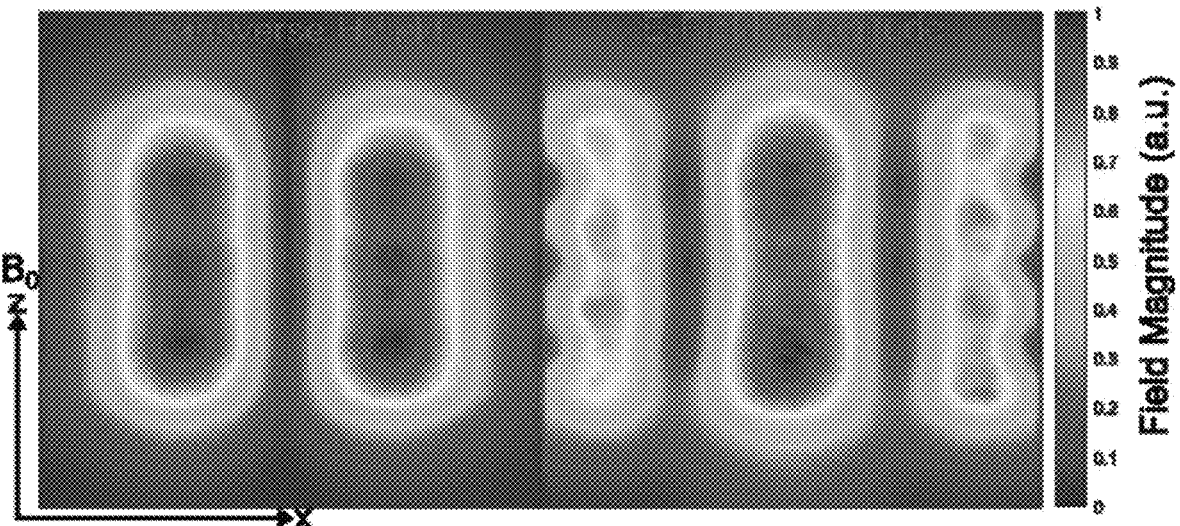
FIG. 50 shows a chart of the RF field profile for the rectangular MTM slab shown in FIG. 9. The transverse H field is shown on the left and the E field magnitude is shown on the right.
Figure 51:
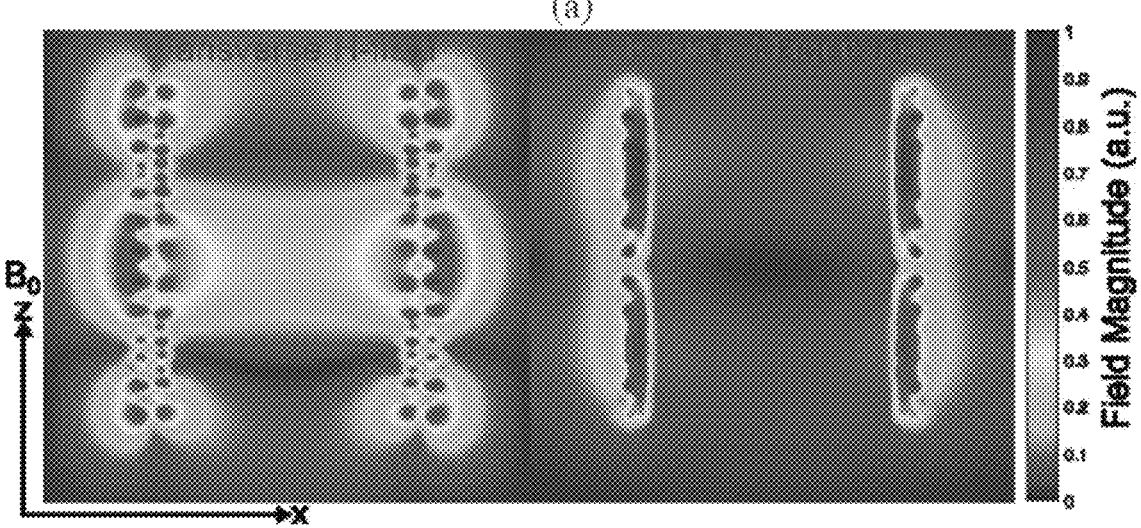
FIG. 51 shows a chart of the RF field profile for the cylindrical MTM liner shown in FIG. 10. The transverse H field is shown on the left and the E field magnitude is shown on the right.

The simulated dispersion curves for the cylindrical case are shown in FIG. 37 and for the rectangular case in FIG. 33. To fit the 2D TL analysis, the $C_x$ and $C_y$ were initially chosen to match the values expected from a simple parallel-plate-capacitor interpretation, then tuned along with $L_x$ and $L_y$ to approximate the dispersion of all modes at $K_z d_z$=pi/2. The mutual inductance terms were found by approximating the slopes of the dispersion curves. For the rectangular case: $C_y$=28 pF, $C_x$=43 pF. For the cylindrical case: $C_y$=4.6 pF, $C_x$=56 pF. For both: $L_x$=50 nH, $L_y$=12 nH, $K_{01}$=−0.10, $K_{02}$=−0.02, $K_{11}$=0.015. The impact of $C_z$=0.2 pF and $C_{yd}$=0.11 pF are negligible at 128 MHz. The close match indicates that the 2D TL can closely represent and predict the behavior of the MTM liner. However, there is some discrepancy, especially for the $HE_{01}$ case due to the TL model's simplifications. The RF field profiles of the rectangular slab and cylindrical liner (single-port excitation) are shown in FIGS. 50 and 51, respectively. The flatness of the dispersion curve results in a superposition of multiple longitudinal resonances on the rectangular slab, but this is not detrimental for the use as a receive array. The cylindrical liner produces a homogenous magnetic field in the center of the liner as required.

The representation of the metamaterial as a 2D transmission line provides a comprehensive method to determine the tuning elements required for its application to MRI resonators. The relation of the 2D TL model to the effective-medium representation may also be considered.

FIG. 33 shows the propagation constant with frequency for different modes for the rectangular waveguide. FIG. 37 shows the propagation constant with frequency for different modes for the circular waveguides. The results predicted by the circuit equivalent model analysis (solid), Eigenmode simulation with single unit-cell (dashed) and finite unit cell (dotted) are shown.

FIG. 50 shows a field map for the rectangular (in a plane offset by 5 cm from liner center) MTM liners at 128 MHz (3 T MRI). FIG. 51 shows a field map for the cylindrical MTM liners at 128 MHz (3 T MRI). Maps are normalized to their respective maxima.

Disclosed herein are further details and context of an embodiment of a metamaterial slab and its use as a receive array in an MRI.

Also disclosed herein are metamaterial liner design methods for MRI. The concepts, theory and methods are integrated into a framework for design of RF coils/resonators for MRI. Some advantages of Radio-Frequency MTMs over conventional methods are as follows: MTMs may improve MRI in both transmit and receive applications. Disclosed herein are methods to evaluate/design MTMs for MRI with an MTM liner structure.

Figure 36:
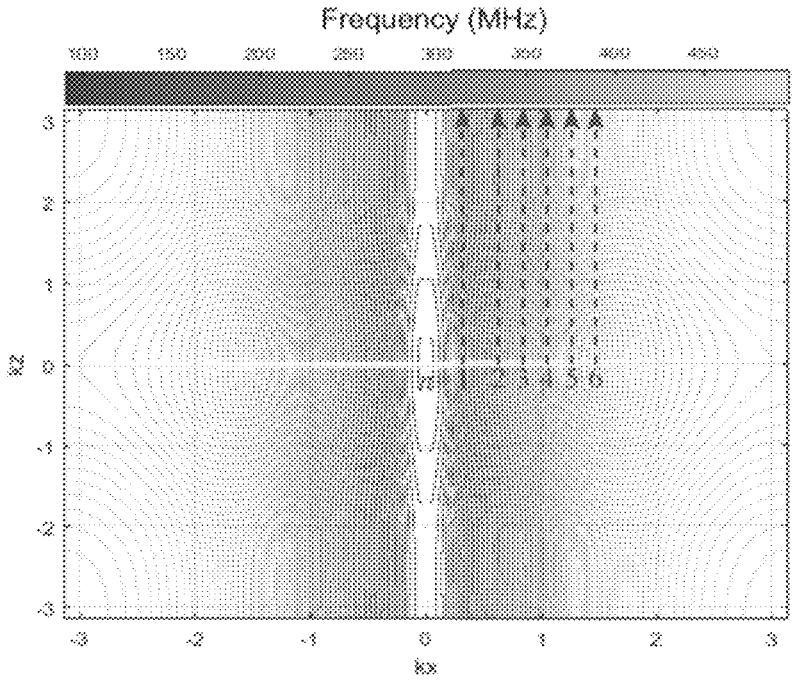
FIG. 36 shows a graph of dispersion relations for different frequencies for the model in FIG. 10.

FIGS. 37 and 36 show MTM liner dispersion for a cylindrical case. FIG. 6 shows an MTM unit cell a single row cylindrical array of which, shown in FIG. 8, may be combined with further cylindrical arrays to make up the MTM liner. For the cylindrical liner $k_\phi N_\phi d_\phi = 2\pi n_\phi$, $n_\phi = 1, 2, 3, \ldots$.

Figure 31:
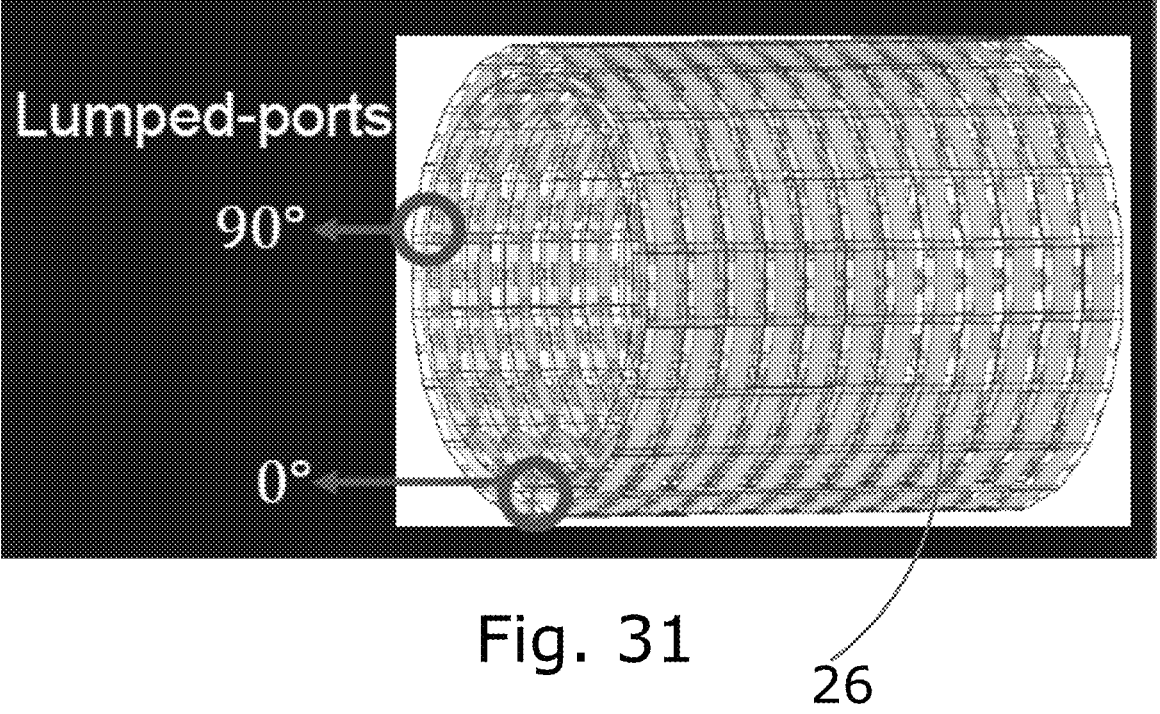
FIG. 31 shows the cylindrical MTM liner in FIG. 10 with lumped ports used for full-wave simulations.

FIG. 31 shows the cylindrical MTM liner with lumped ports used for full-wave simulations.

Figure 52:
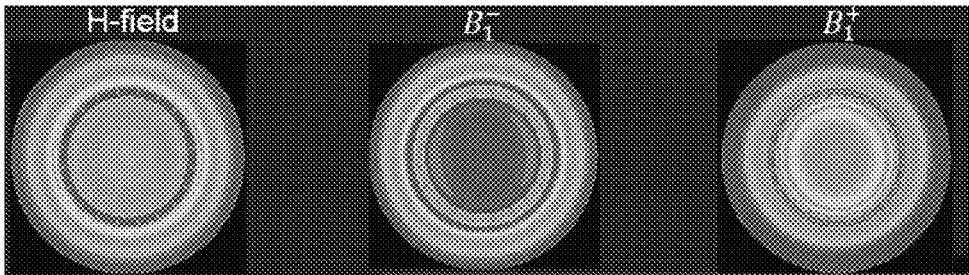
FIG. 52 is an axial view graph of the full wave simulations for the cylindrical liner shown in FIG. 10. The H-field is shown on the left, the $B_1^-$ field shown in the middle, and the $B_1^+$ field is shown on the right.

FIGS. 51 and 52 illustrate the full wave simulations for a cylindrical case (128 MHz). FIG. 52 shows a central axial slice.

An embodiment of the invention was validated using H-probes and a vector network analyzer. The simulations have shown where to expect minima/maxima for desired mode. As a probe is scanned along an MTM, transmission minima and maxima occur at different frequencies and location for a given mode. Based on this, it may be determined at what frequency the desired mode occurs and whether tuning is necessary.

To test an embodiment of the invention, three cases were analyzed and compared. The test cases were as follows: a body coil and phantom only; a body coil, phantom, and one MTM; a BC, phantom, and two MTMs (one on top and bottom) which is depicted in FIG. 1.

Figures 57, 58:
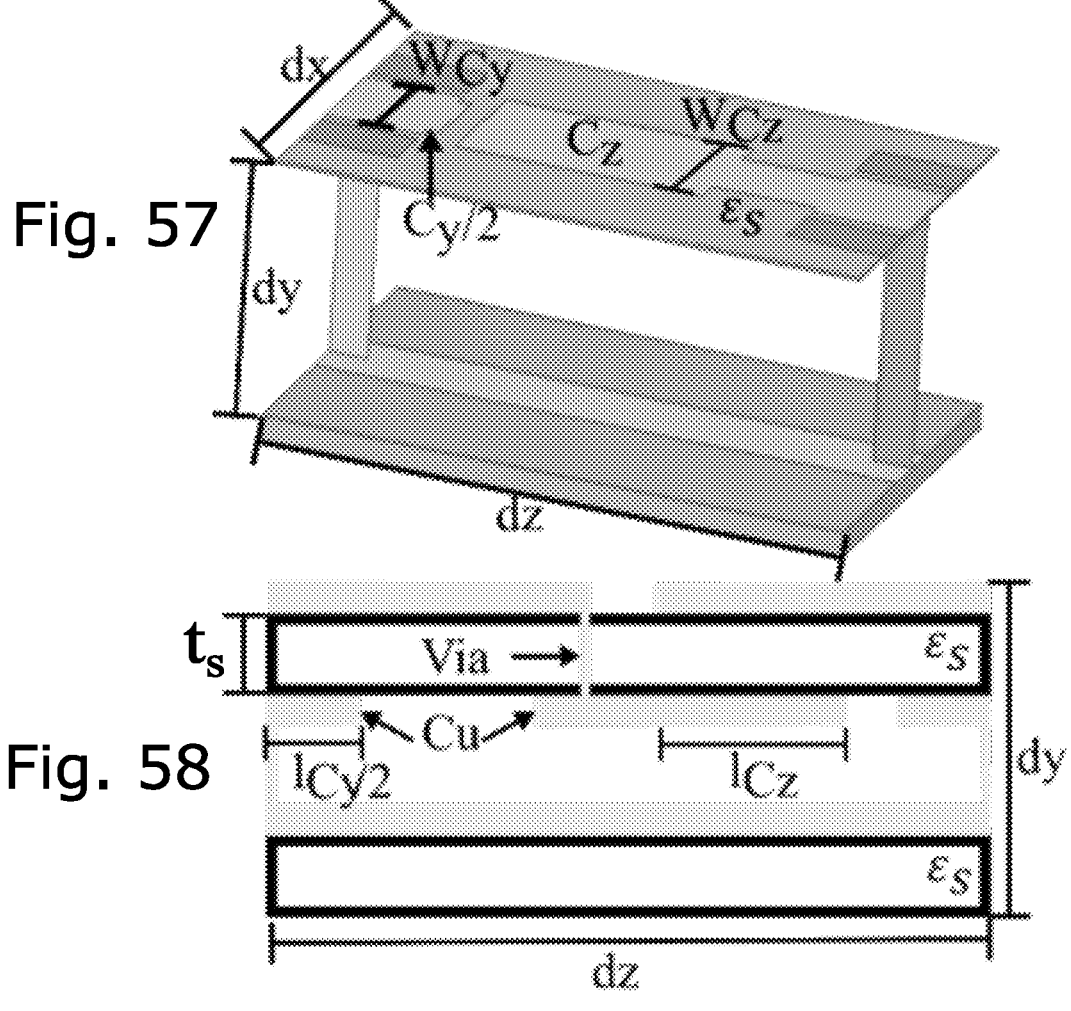
FIG. 57 shows an isometric view of another embodiment of an MTM unit cell.
FIG. 58 shows a side view of an embodiment of model of the MTM unit cell shown in FIG. 57.
Figure 60:
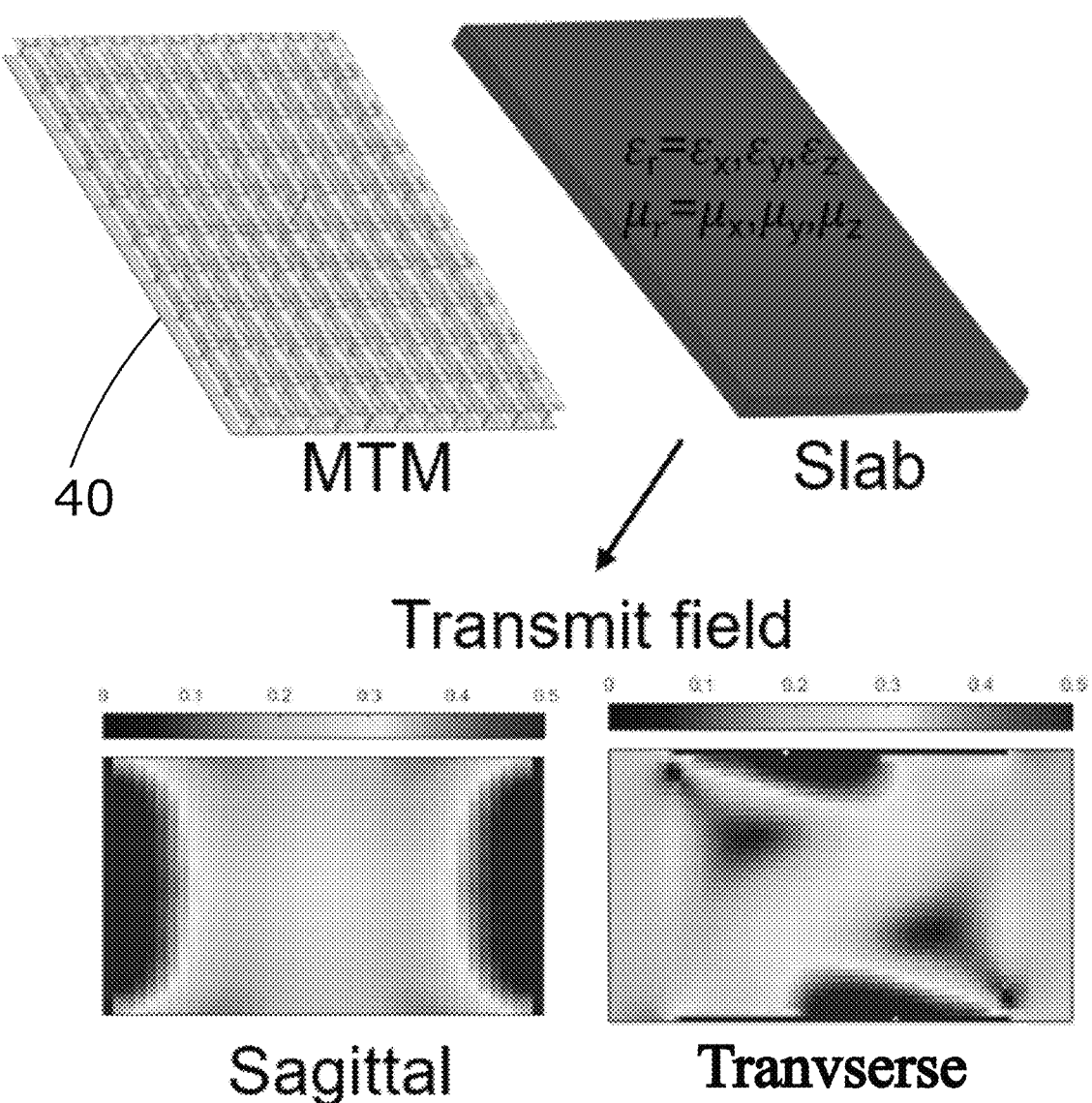
FIG. 60 shows an embodiment of an MTM slab and charts of the transmit field results for the slab.

An embodiment of a metamaterial slab as shown in FIG. 60 is made up of a large number of the unit cells as shown in FIG. 57. A response of the metamaterial slab to the $TE_{11}$ excitation profile was used to derive the anisotropic effective medium parameter (permeability mu, and permittivity epsilon) via a circuit model. A $TE_{11}$ excitation profile emulates an ideal birdcage excitation. The derived value for the most relevant effective medium parameter ($\mu x$) is shown in FIG. 59. It was determined that the metamaterial has a negative magnetic response, primarily to one direction, at 128 MHz. In the simulation, we create a slab with the derived medium parameters and determine the fields. This derivation and simulation method gives an idea of how the structure can be tuned to optimize the effective medium for homogeneity. The embodiment of the invention may be optimized by performing the following: vary the parameters, determine which parameter provide best homogeneity, tune slab to achieve those parameters values according to circuit derivation. The fields of the material with effective medium and actual slabs are in close agreement (fields with actual metamaterial slab shown in FIGS. 59-60).

While performing the analysis, the data inside the ellipsoid was considered. It was determined that the measured and simulated results match quite well. The major difference is in the transmit efficiency improvement which may be due to the ellipsoid selection. The standard deviation of the flip angle decreased which indicates increased homogeneity (coefficient of variation, CoV, reduced by 4.9%). The analysis also shows a major improvement in the elimination of the anterior and posterior voids. Further, the transmit efficiency improved 39% over the existing art. Additionally, the 10 g averaged SAR value decreased by 32%. The SAR improvement is within the realm of dielectric pads that are used for abdominal imaging. It was found that the homogeneity improvement was not as high as the pads but was close to the lower bound. It was also determined that there was a variation due to different BMIs in the simulations. As a result, BMI may need to be accounted for in the simulations or perform in vivo testing for a more accurate comparison.

An embodiment of the Metamaterial slab 40 may consist of 11×10 unit-cells, where adjacent 1D transmission line sections are connected by broadside mutual inductance coupling in the x-direction, resulting in propagation along 2 dimensions (see FIG. 48). The MTM acts as slab of material with anisotropic permittivity: $\varepsilon = \varepsilon_0 \text{diag}(\varepsilon_x, \varepsilon_y, \varepsilon_z)$ and permeability: $\mu = \mu_0 \text{diag}(\mu_x, \mu_y, \mu_z)$. The Metamaterial slab 40 may be designed and tuned so that the $\varepsilon_y$, $\mu_z$, and $\mu_x$ are the primary electromagnetic parameters giving rise to the altered transmit field, where a large effective $\varepsilon_y$ is expected, making the Metamaterial slab 40 mimic a high permittivity slab of material. The method of determining the correct tuning is described in Maunder A, De Zanche N, Iyer A K. "Design and Modelling of Metamaterial Resonators for 3 Tesla Magnetic Resonance Imaging," 2021 International Applied Computational Electromagnetics Society Symposium (ACES) (2021), which is hereby incorporated by reference in its entirety.

The capacitive tuning elements consist of overlapping copper strips (18 µm thick) on thin ROGERS 3006™ substrate (0.25 mm thick, $\varepsilon=6.15$, tan $\delta=0.002$), while a bottom 2 mm thick polycarbonate substrate provides mechanical support along with PVC structural blocks and nylon screws.

In simulation (Ansys, HFSS) the copper is modelled with a conductivity of 5.8×10 S/m and the BC is designed to closely match the field profile of the BC used in the Philips Achieva 3 T scanner. The metamaterial slab 40 was simulated with a companion array and phantom. The comparison array simulated was simulated on its own with a phantom. In another simulation, the Metamaterial slab 40 was simulated with a phantom. The results show the H-field distribution for the Metamaterial slab 40. The simulation results also show the determined current minima. The current minima locations are port locations which create naturally decoupled ports.

Figure 56:
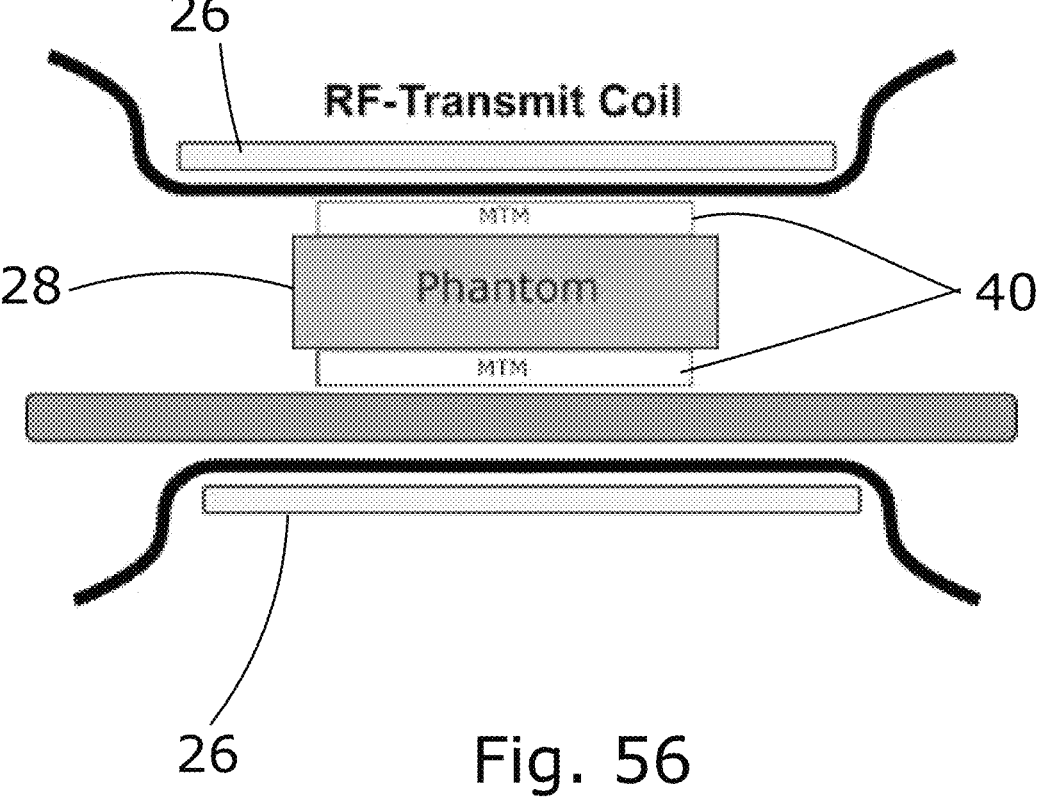
FIG. 56 shows a side cross-section view of an embodiment of a model of RF transmit coils, two MTM slabs, and a phantom.

Physical and simulation models were used in testing the metamaterial slab 40. The simulation was done by ANSYS HFSS as follows: an eigenmode was used for a strip; a full liner was used with a phantom; a full liner was used with a phantom and a body coil (BC); and 2 liners used with a phantom and a BC. A metamaterial slab was also constructed and validated. FIG. 56 shows the testing diagram or simulation model in a side view.

FIG. 58 illustrates the layer view and labelled unit-cell simulation model. FIG. 1 illustrates an isometric view of a full simulation model including the phantom, two Metamaterial slabs 40, and the BC. FIG. 59 shows the results for permeability $\mu$ in the x-direction according to frequency. FIG. 60 illustrates the metamaterial slab 40 and the transmit field results.

Using 1 kW root-mean-square (RMS) accepted power with quadrature drive, simulated fields were compared to flip angle (FA) maps acquired by varying the prescribed FA (50°, 100° and 150°) using a 2D multi-slice SPGR sequence and pixelwise least squares fitting according to the SPGR equation (500 Hz/pixel, 70×70×33 matrix, 6×6×6 mm3 resolution, TE=2.6 ms, TR=800 ms) in a phantom with 3.6 g/L NaCl and 1.96 g/L $CuSO_4 \cdot 5H_2O$ aqueous solution.

Figure 53:
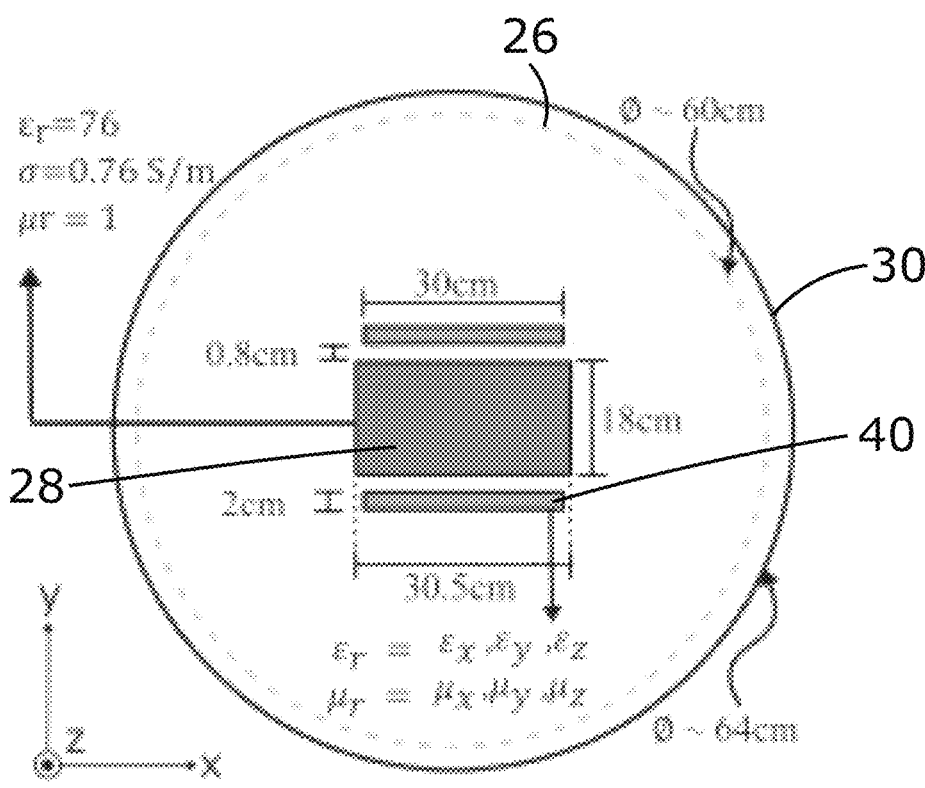
FIG. 53 shows an axial view of an embodiment of two MTM slabs around a phantom and within a birdcage coil.
Figure 54:
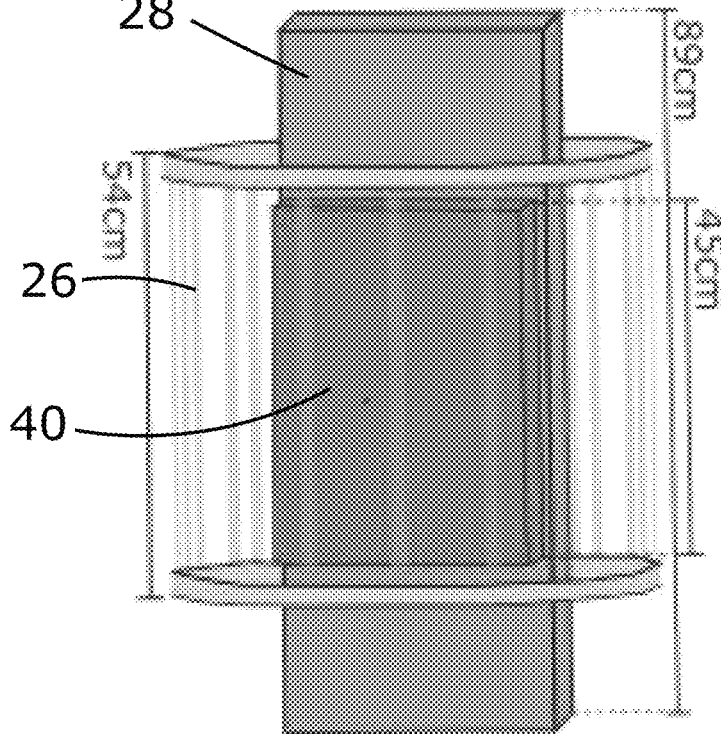
FIG. 54 shows an isometric view of the embodiment shown in FIG. 53.
Figure 55:
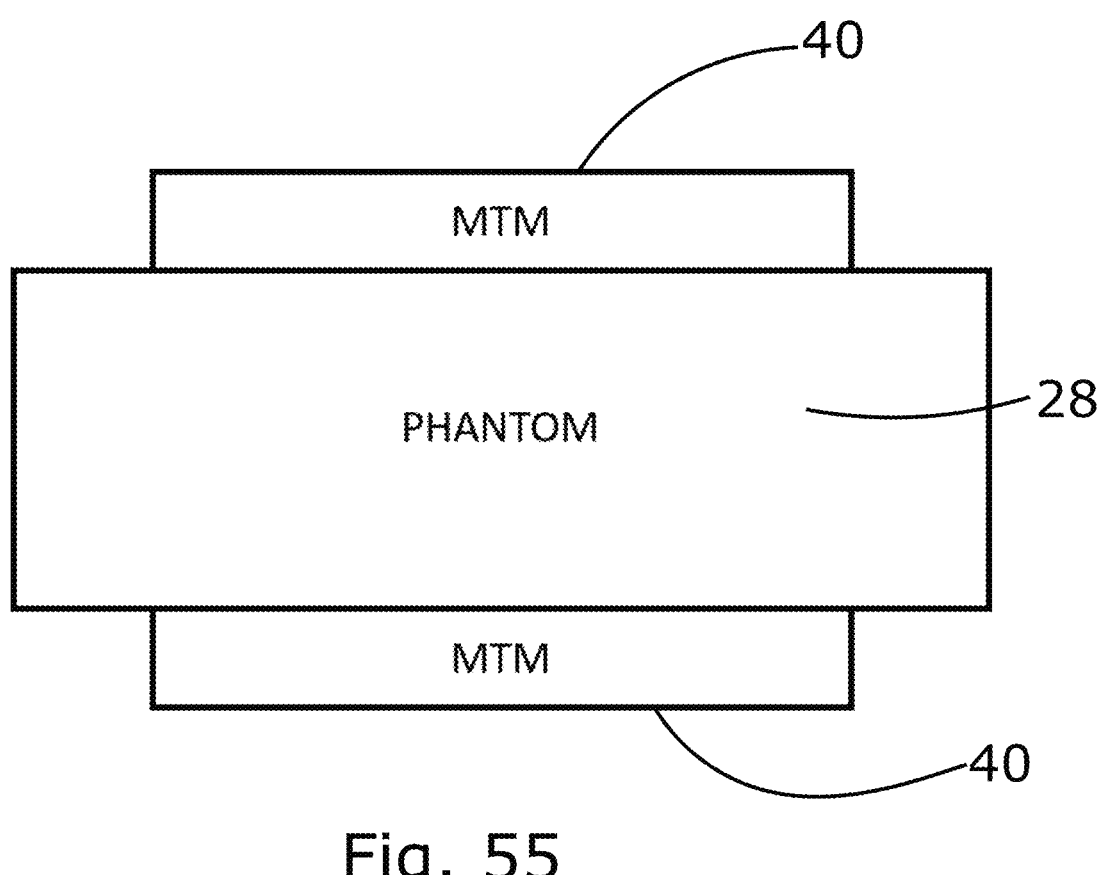
FIG. 55 is a photograph of an embodiment of two MTM slabs and phantom.

FIG. 53 is an axial view and FIG. 54 a side view of an embodiment of a scan target 28, such as a phantom, a transmit device 26 such as a birdcage coil, and two metamaterial slabs 40 with geometry with labelled electromagnetic parameters (permittivity and permeability). In FIG. 54, the simulation model with the same geometry and in FIG. 55 a matching measurement setup are shown.

In FIGS. 61A-C, the simulation results of the transmit efficiency (1 kW RMS power) in three orthogonal central planes are shown in FIG. 61A for the BC without the metamaterial slabs 40, FIG. 61B with a Metamaterial slab 40 on the bottom, and FIG. 61C with metamaterial slabs 40 on the top and bottom. The mean and standard deviation obtained in the outlined ellipsoid region is labelled for each. In FIG. 62A-B, the difference in transmit efficiency with a BC and one metamaterial slab 40 (FIG. 62A) and two metamaterial slabs 40 (FIG. 62B) compared to the BC without any metamaterial slab demonstrated the regional increase provided by the Metamaterial slabs 40. The simulated transmit efficiency results closely match the measured FA (flip angle) maps, shown in the same order in FIGS. 63A-64B.

Figures 63A, 63B, 63C:
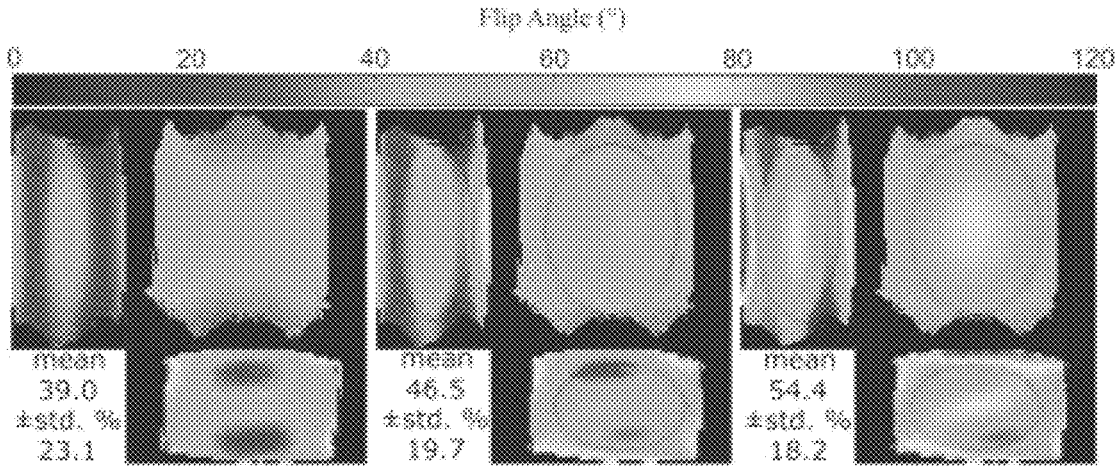
FIG. 63A is a chart of the measured results of the flip angle (FA) in three orthogonal central planes for the BC without the MTM slabs.
FIG. 63B is a chart of the measured results of the FA in three orthogonal central planes for an embodiment of a BC with an MTM slab on the bottom.
FIG. 63C is a chart of the measured results of the FA in three orthogonal central planes for an embodiment of a BC with two MTM slabs, one on the top and one on the bottom.
Figures 64A, 64B:
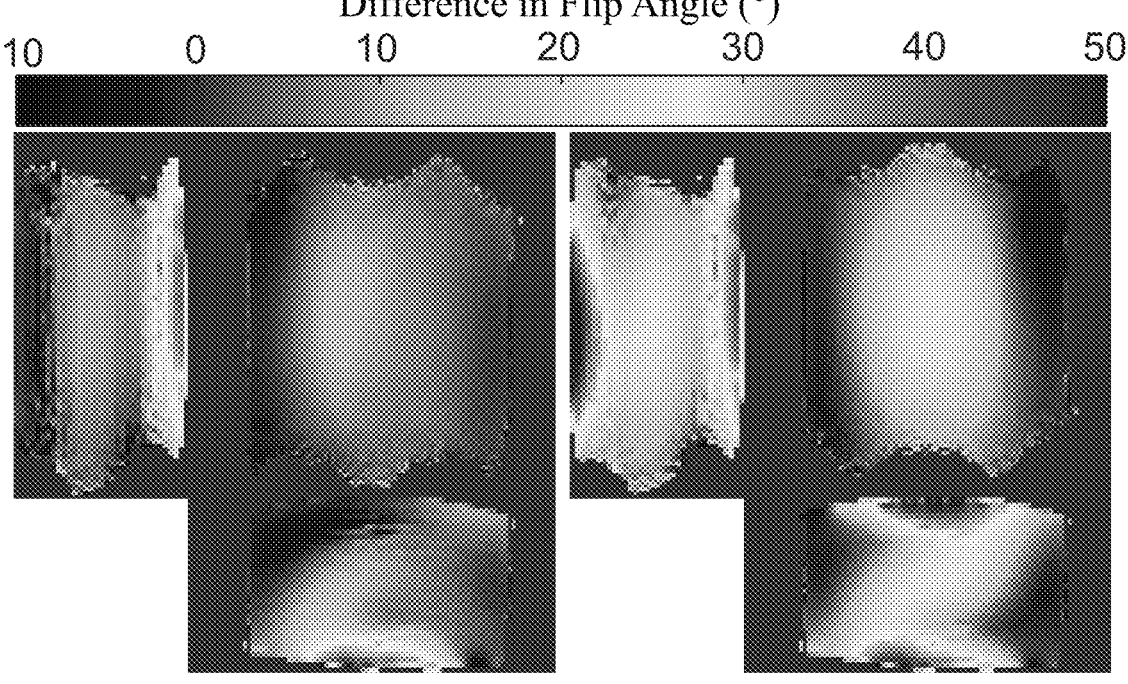
FIG. 64A is a chart of the difference in flip angle of an embodiment with a BC and one MTM slab compared to without an MTM slab.
FIG. 64B is a chart of the difference in flip angle of an embodiment with a BC and two MTM slabs compared to without an MTM slab

In FIGS. 63A-63C, the measured results of the FA achieved for a prescribed 90° (after automatic calibration—the angle may deviate from the exact number specified) are shown in three orthogonal central planes for the BC without the Metamaterial slabs 40 (FIG. 63A), with a metamaterial slab 40 on the bottom (FIG. 63B), and with metamaterial slabs 40 on the top and bottom (FIG. 63C). In FIG. 64A-64B, the difference in transmit efficiency with a BC and one metamaterial slab 40 (FIG. 64A), and two metamaterial slabs 40 (FIG. 64B) compared to the BC without any metamaterial slab demonstrated the regional increase provided by the metamaterial slabs 40.

The largest difference is a 39% vs. 27% increase in transmit efficiency with two Metamaterial slabs 40 observed in measurement compared to simulation, which may be partially explained by positioning differences of the region of interest ellipsoid (11.5×15×7.5 mm radii). The overall FA homogeneity is improved (CoV decreased from 23.1% to 18.2%), and a further benefit is obtained by the elimination of voids in the field near the anterior and posterior. Also, a significant improvement in SAR is observed as shown in FIGS. 65A-65C.

The metamaterial slab 40 improves RF field homogeneity in a homogeneous phantom (CoV reduced by 4.9%), while reducing the local 10 g averaged SAR by 32%. Improvement was most evident in the elimination of null regions in the RF transmit field.

Figures 65A, 65B, 65C:
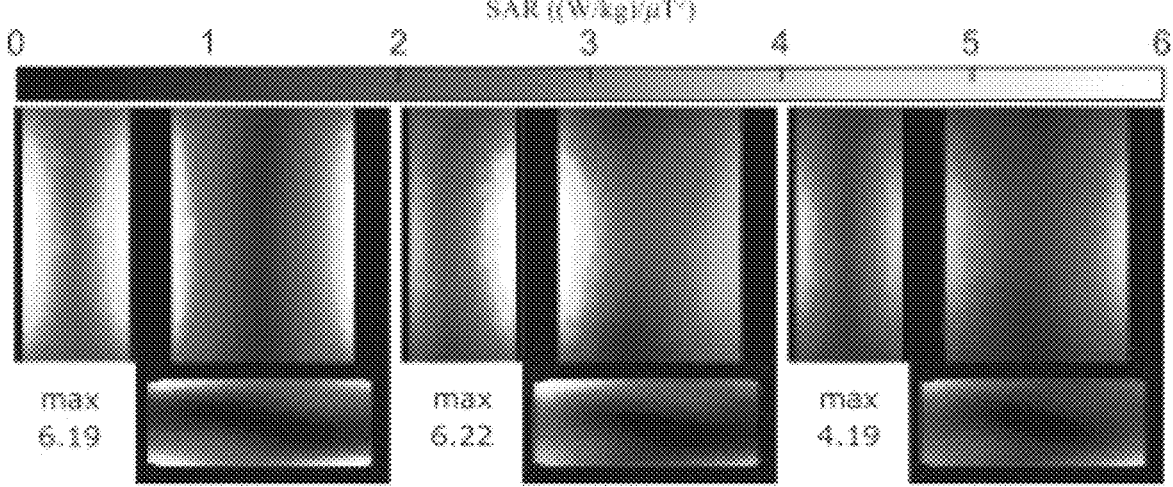
FIG. 65A is a chart of the simulated 10 g averaged SAR maximum intensity projection maps in three orthogonal planes normalized to the mean transmit efficiency in the region outlined in FIGS. 60A-62B for an embodiment of the BC without the MTM slabs.
FIG. 65B is a chart of the simulated 10 g averaged SAR maximum intensity projection maps in three orthogonal planes normalized to the mean transmit efficiency in the region outlined in FIGS. 60A-62B for an embodiment of the BC with a MTM slab on the bottom.
FIG. 65C is a chart of the simulated 10 g averaged SAR maximum intensity projection maps in three orthogonal planes normalized to the mean transmit efficiency in the region outlined in FIGS. 60A-62B for an embodiment of the BC with MTM slabs on the top and bottom.

In FIGS. 65A-65C, the simulated 10 g averaged SAR maximum intensity projection maps in three orthogonal planes normalized to the mean transmit efficiency in the region is shown for the BC without the Metamaterial slabs 40 (FIG. 65A), with a Metamaterial slab 40 on the bottom (FIG. 65B), and with Metamaterial slabs 40 on the top and bottom (FIG. 65C). The maximum intensity projection maps demonstrate that the 10 g averaged local SAR normalized to a mean 1 μT transmit field is reduced from 6.19 W/kg with only the BC (FIG. 65A) to 4.19 W/kg with two metamaterial slabs 40 (FIG. 65C). The maximum obtained within the phantom is labelled for each. By contrast abdominal imaging with a dielectric pad, as found by Vorobyev V et al, Magn Res Med, 2022; 83:496-508, created only a: 21%-42% SAR decrease and a 6.7%-16% homogeneity increase.

SAR improvement was within the realm of dielectric pad used for abdominal imaging. Homogeneity improvement was not as high as the pads but close to lower bound. There was variation due to different BMIs in simulations; the slab could be tailored to individuals to compensate. The MTM slab is confirmed to have improved the performance in transmit efficiency, field homogeneity (voids eliminated), and reducing the maximum SAR.

Immaterial modifications may be made to the embodiments described here without departing from what is covered by the claims.

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The invention claimed is:

1. A metamaterial structure configured to passively interact with a field generated by a transmit device within the MRI system to improve one or more of homogeneity of the field within a scan target, specific absorption rate within the scan target, and strength of the field within the scan target when the metamaterial structure is present within a bore of the MRI system with the scan target, the metamaterial structure comprising:

a first layer generally defining a surface and a second layer offset from the surface generally defined by the first layer, the first layer and the second layer interacting to form a 2D transmission line supporting radio frequency (RF) current along the surface in a first direction tangential to the surface and in a second direction tangential to the surface and transverse to the first direction, the first layer and the second layer being connected via linking capacitors;

the metamaterial structure being configured so that, of a set of natural resonance modes of the metamaterial structure, a natural resonance mode of the set of natural resonance mode having greatest coupling to the field generated by the transmit device has a natural frequency different from a transmit frequency of the transmit device.

2. The metamaterial structure of claim 1 comprising tuning elements that add or remove capacitance or inductance to alter a characteristic of the metamaterial structure.

3. The metamaterial structure of claim 2 in which the tuning elements include inductance tuning elements arranged to tune inductances in series with the linking capacitors.

4. The metamaterial structure of claim 1 in which the first layer comprises a grid of traces, the grid comprising first traces extending in the first direction and second traces extending in the second direction, the first traces including first capacitors between the second traces.

5. The metamaterial structure of claim 4 in which the second traces include second capacitors between the first traces.

6. The metamaterial structure of claim 5 further comprising tuning elements that add or remove capacitance or inductance to alter a characteristic of the metamaterial structure and in which the tuning elements are arranged to adjust capacitance of the second capacitors.

7. The metamaterial structure of claim 5 in which the linking capacitors connect to the second traces, the second traces also including inductors in series with the second capacitors.

8. The metamaterial structure of claim 1 in which the natural resonance mode having the greatest coupling has a 1-wavelength or multiple of unity wavelength standing wave pattern in two dimensions.

9. The metamaterial structure of claim 8 in which the natural resonance mode having the greatest coupling with the field generated by the transmit device within the MRI system is the first resonance of the $HE_{n1}$ mode.

10. The metamaterial structure of claim 1 in which the metamaterial structure can be characterized as an effective medium with anisotropic permittivity and permeability.

11. The metamaterial structure of claim 1 being connected to RF receive circuitry at a port to act as a receiver for the MRI system.

12. The metamaterial structure of claim 11 in which the port is arranged to connect the RF receive circuitry to the metamaterial structure at a location selected to generally correspond to a current minimum of a current distribution induced by the passive interaction of the metamaterial structure with the field generated by the transmit device.

13. The metamaterial structure of claim 11 further comprising one or more additional ports connected to the RF receive circuitry or to additional RF receive circuitry to act as multiple receive elements for the MRI system.

14. The metamaterial structure of claim 13 in which the port is arranged to connect the RF receive circuitry to the metamaterial structure at a location selected to generally correspond to a current minimum of a current distribution induced by the passive interaction of the metamaterial structure with the field generated by the transmit device and in which the one or more additional ports are arranged to connect the RF receive circuitry to the metamaterial structure at one or more additional locations selected to generally correspond to one or more additional current minima of the current distribution induced by the passive interaction of the metamaterial structure with the field generated by the transmit device.

15. A metamaterial structure configured to passively interact with a field generated by a transmit device within the MRI system to improve one or more of homogeneity of the field within a scan target, specific absorption rate within the scan target, and strength of the field within the scan target when the metamaterial structure is present within a bore of the MRI system with the scan target, the metamaterial structure comprising:

a first layer generally defining a surface and a second layer offset from the surface generally defined by the first layer, the first layer and the second layer interacting to form a 2D transmission line supporting radio frequency (RF) current along the surface in a first direction tangential to the surface and in a second direction tangential to the surface and transverse to the first direction, the first layer comprises a grid of traces, the grid comprising first traces extending in the first direction and second traces extending in the second direction, the first traces including first capacitors between the second traces and the second traces include second capacitors between the first traces, the first layer and the second layer being connected via linking capacitors, in which the linking capacitors connect to the second traces, the second traces also including inductors in series with the second capacitors.

16. The metamaterial structure of claim 15 in which the metamaterial further comprises tuning elements that add or remove capacitance or inductance to alter a characteristic of the metamaterial structure and in which the tuning elements are arranged to adjust capacitance of the second capacitors.

17. A metamaterial structure configured to passively interact with a field generated by a transmit device within the MRI system to improve one or more of homogeneity of the field within a scan target, specific absorption rate within the scan target, and strength of the field within the scan target when the metamaterial structure is present within a bore of the MRI system with the scan target, the metamaterial structure comprising:

a first layer generally defining a surface and a second layer offset from the surface generally defined by the first layer, the first layer and the second layer interacting to form a 2D transmission line supporting radio frequency (RF) current along the surface in a first direction tangential to the surface and in a second direction tangential to the surface and transverse to the first direction, the first layer and the second layer being connected via linking capacitors, the metamaterial structure comprising tuning elements that add or remove capacitance or inductance to alter a characteristic of the metamaterial structure, the tuning elements including inductance tuning elements arranged to tune inductances in series with the linking capacitors.

18. The metamaterial structure of claim 17 in which the first layer comprises a grid of traces, the grid comprising first traces extending in the first direction and second traces extending in the second direction, the first traces including first capacitors between the second traces.

19. The metamaterial structure of claim 18 in which the second traces include second capacitors between the first traces.

20. The metamaterial structure of claim 19 in which the tuning elements include capacitance tuning elements arranged to adjust capacitance of the second capacitors.

* * * * *